US006181723B1

(12) United States Patent
Okubo et al.

(10) Patent No.: US 6,181,723 B1
(45) Date of Patent: Jan. 30, 2001

(54) SEMICONDUCTOR LIGHT EMITTING DEVICE WITH BOTH CARBON AND GROUP II ELEMENT ATOMS AS P-TYPE DOPANTS AND METHOD FOR PRODUCING THE SAME

(75) Inventors: Nobuhiro Okubo, Ikoma; Masaya Ishida, Kashiba; Yoshiro Akagi, Osaka; Masanori Watanabe; Fumihiro Konushi, both of Nara, all of (JP)

(73) Assignee: Sharp Kabushiki Kaisha(JP)

( * ) Notice: Under 35 U.S.C. 154(b), the term of this patent shall be extended for 0 days.

(21) Appl. No.: 09/073,106

(22) Filed: May 5, 1998

(30) Foreign Application Priority Data

May 7, 1997 (JP) ... 9-116645
May 30, 1997 (JP) ... 9-141439
Jun. 3, 1997 (JP) ... 9-144892

(51) Int. Cl.[7] ... H01S 5/00
(52) U.S. Cl. ... 372/45; 372/46
(58) Field of Search ... 372/45, 46; 257/102, 257/13; 438/45, 46

(56) References Cited

U.S. PATENT DOCUMENTS 5,164,329 * 11/1992 Moyer et al. ... 438/45
5,300,788 * 4/1994 Fan et al. ... 257/13
5,386,429 * 1/1995 Naito et al. ... 372/46
5,387,544 * 2/1995 Hayafuji ... 438/46

FOREIGN PATENT DOCUMENTS 5-235468 9/1993 (JP) .
6-163585 6/1994 (JP) .

* cited by examiner

*Primary Examiner*—Teresa M. Arroyo
*Assistant Examiner*—Quyen P. Leung
(74) *Attorney, Agent, or Firm*—Morrison & Foerster LLP

(57) ABSTRACT

A light emitting device includes: a plurality of n-type III–V group compound semiconductor layers; a plurality of p-type III–V group compound semiconductor layers; and an active layer. Carbon atoms and II-group element atoms are both added to at least one of the plurality of p-type III–V group compound semiconductor layers. Alternatively, carbon atoms and Si atoms are both added to at least one of the plurality of n-type III–V group compound semiconductor layers. Another semiconductor light emitting device has a current blocking structure formed on the double hetero (DH) junction structure, and the current blocking structure at least includes a two-layered n-type current blocking layers including a Se-doped n-type first current blocking layer provided closer to the DH junction structure and a Si-doped n-type second current blocking layer formed on the n-type first current blocking layer.

6 Claims, 22 Drawing Sheets

SEMICONDUCTOR LIGHT EMITTING DEVICE WITH BOTH CARBON AND GROUP II ELEMENT ATOMS AS P-TYPE DOPANTS AND METHOD FOR PRODUCING THE SAME

BACKGROUND OF THE INVENTION

1. Field of the Invention

The present invention relates to a III–V group compound semiconductor light emitting device such as a semiconductor laser device or a light emitting diode (LED) device, and a method for producing the same.

2. Description of the Related Art

A III–V group compound semiconductor light emitting device such as a semiconductor laser device or an LED device generally has at least one (typically a plurality of) crystal growth layer of the p-type conductivity (hereinafter, referred to also as the "p-type layer") and at least one (typically a plurality of) crystal growth layer of the n-type conductivity (hereinafter, referred to also as the "n-type layer"). These crystal growth layers are typically formed by using a crystal growth method such as a liquid phase epitaxial (LPE) method, a molecular beam epitaxial (MBE) method, or a metalorganic chemical vapor deposition (MOCVD) method, which is excellent in mass productivity and allows a very thin film to be grown.

In the LPE method, although a high quality semiconductor crystal can be formed with a relatively simple apparatus, it is difficult to produce a uniform crystal over a large area. On the other hand, the MBE method and the MOCVD method are more suitable processes for mass production, and are widely used at present. The MBE method is a process in which solid elements forming a compound semiconductor are heated in a high vacuum and a substrate is irradiated with beams of the evaporated elements. With this method, a pure crystal can be relatively easily obtained. In the MOCVD method, under an atmospheric pressure or a pressure depressurized to about 1/10 atm, elements forming a compound semiconductor are carried in a gaseous form such as an organic compound or a hydrogen compound, so as to be chemically reacted on a substrate, thereby forming an intended compound semiconductor.

FIG. 1 is a cross-sectional view illustrating a typical structure of a III–V group compound semiconductor laser device produced by using the MOCVD method.

In the cross-sectional view of FIG. 1, an n-type GaAs buffer layer 1, an n-type AlGaAs cladding layer 2, an AlGaAs active layer 3, a p-type AlGaAs first cladding layer 4, a p-type GaAs etching stop layer 5, a p-type AlGaAs second cladding layer 6 and a p-type GaAs protective layer 7 are deposited in this order on an n-type GaAs substrate 14, thereby forming a layered structure. In this layered structure, the layers above the p-type GaAs etching stop layer 5 form a stripe-shaped mesa structure (a mesa stripe). An n-type AlGaAs current blocking layer 8, an n-type GaAs current blocking layer 9 and a p-type GaAs planarizing layer 10 are buried on both sides of the mesa stripe.

Moreover, a p-type GaAs contact layer 11 is formed on the p-type GaAs protective layer 7 and p-type GaAs planarizing layer 10. A p-side metal electrode 12 and an n-side metal electrode 13 are respectively formed on the p-type GaAs contact layer 11 and on the reverse surface of the n-type GaAs substrate 14 by, for example, a vapor deposition method.

FIG. 2 is a cross-sectional view illustrating another typical structure of a III–V group compound semiconductor laser device produced by using the MOCVD method.

In the cross-sectional view of FIG. 2, a Se-doped n-type GaAs buffer layer 22, a Se-doped n-type AlGaAs cladding layer 23, an undoped AlGaAs active layer 24, a Zn-doped p-type first cladding layer 25 and a Se-doped n-type AlGaAs current blocking layer 26 are formed in this order on an n-type GaAs substrate 21. A portion of the n-type current blocking layer 26 is removed in a stripe-shaped pattern, thereby forming a current path 17. A Zn-doped p-type second cladding layer 28 and a Zn-doped p-type contact layer 29 are formed on the n-type current blocking layer 26 including the stripe-shaped portion 17. A p-side electrode 18 and an n-side electrode 19 are respectively formed on the p-type contact layer 29 and on the reverse surface of the n-type GaAs substrate 21.

FIG. 3 is a diagram schematically illustrating a structure of a vapor deposition apparatus of a depressurized horizontal RF heating furnace type which can be used for growing the semiconductor layers included in the semiconductor laser device illustrated in FIG. 1 or 2.

In the apparatus illustrated in FIG. 3, trimethylgallium (TMGa), trimethylaluminum (TMAl) or trimethylindium (TMIn) is used as a III-group material compound; arsine ($AsH_3$) or phosphine ($PH_3$) as a V-group material compound; monosilane ($SiH_4$), disilane ($Si_2H_6$) or hydrogen selenide ($H_2Se$) as an n-type dopant material; and diethylzinc (DEZn), dimethylzinc (DMZn) or trimethylarsenic (TMAs) as a p-type dopant material. Carbon tetrachloride ($CCl_4$) may also be used as a carbon source.

In a crystal growth process, a substrate is placed inside a reaction chamber (growth chamber) 30, the internal pressure of the reaction chamber 30 is set to a predetermined value (e.g., about 76 Torr), and the substrate temperature is set to a predetermined value (e.g., about 700° C.) using an RF coil 31. Then, mass flow controllers (MFCs) and valves are appropriately controlled to appropriately select, and set the flow rate of, the respective materials from material sources 32 to 38 and hydrogen supplied from a hydrogen source through a line 39 so as to supply them into the reaction chamber 30 through respective supply lines 40 to 43, thereby growing an intended semiconductor layer on the substrate. Any unwanted gas which may exist in the reaction chamber 30 is exhausted through a line 44.

For example, when forming an n-type AlGaAs layer, $AsH_3$, TMGa, TMAl and an appropriate n-type dopant material are supplied onto the substrate. When forming a Zn (zinc) doped p-type AlGaAs layer, $AsH_3$, TMGa, TMAl and DMZn or DEZn are supplied onto the substrate. When forming a C (carbon) doped p-type AlGaAs layer, TMAs, $AsH_3$. TMGa and TMAl are supplied onto the substrate.

In the MOCVD method, it is likely that organic matter or hydrogen generated after a chemical reaction may be introduced as an impurity into a growing compound semiconductor layer. Particularly, carbon (C) contained in organic matter, when introduced into the compound semiconductor layer, may act as a p-type dopant. Thus, it is likely that a certain amount of carbon may be present in the grown compound semiconductor layer even when carbon tetrachloride ($CCl_4$) is not supplied.

For example, when forming a p-type AlGaAs layer with a high concentration of zinc added thereto, the crystal growth process is performed while reducing the substrate temperature from about 700° C. to about 600° C. during the growth process. Then, a certain amount of carbon atoms are introduced into an AlGaAs crystal layer obtained through the crystal growth process by the MOCVD method. As the Al mole fraction increases carbon atoms are increasingly likely to be introduced. Therefore, carbon atoms, though at a concentration lower than the predetermined zinc atom concentration, will be present in the grown p-type AlGaAs layer.

When forming a p-type AlGaAs layer with a high concentration of carbon added thereto, the crystal growth process is performed while reducing the supply ratio between the V-group material and the III-group material (V/III ratio) from about 60 to about 2 during the growth process. Also in this case, carbon atoms will be present at a concentration of, for example, about $1\times10^{17}$ $cm^{-3}$ in the adjacent n-type AlGaAs layer to which carbon is not intended to be added.

Moreover, as can be seen from the above description of the structure of the apparatus illustrated in FIG. 3, in the formation of a compound semiconductor layer by the MOCVD method, Se or Si is used as the n-type dopant element, and Zn, Mg, C, or the like, is typically used as the p-type dopant element. These dopants should be controlled so as to be present at a predetermined concentration in the intended crystal growth layer. When one of the dopants is used alone, the doping conditions such as the concentration may be controlled relatively easily. However, these dopants diffuse as the substrate is heated during the growth process, whereby an intended concentration profile may not be obtained. Moreover, in the case of a layered structure, complex mutual diffusion of the dopants may occur depending upon the combination of the materials of the adjacent layers or the combination of the dopant types used.

For example, Zn, Be, Mg, or the like, which are II-group elements and used as p-type dopants, are impurities which may diffuse relatively easily, and are difficult to control. Particularly, when such an element is added at a high concentration, precipitation at the interface between the p-type crystal growth layer and the n-type crystal growth layer (the p-n interface), or diffusion toward the substrate surface, occurs significantly.

On the other hand, carbon, which also acts as a p-type dopant, has a small diffusion coefficient, and thus is often used in HBTs or HEMTs. However, when carbon is used as the p-type dopant in a semiconductor light emitting device, although the carbon itself does not diffuse, diffusion of Si or Se used as an n-type dopant may cause a problem that the C doped p-type layer is inverted to the n-type.

Moreover, when only carbon as a p-type dopant is added into a crystal layer of a III–V group compound semiconductor, in order to realize an intended amount of addition, it is typically required to set the supply ratio between the V-group material and the III-group material (V/III ratio) at a small value. However, under such a setting, it is likely that an impurity such as oxygen or water, in addition to carbon, may be introduced into the crystal layer, whereby the electrical and/or optical characteristics of the obtained p-type III–V group compound semiconductor crystal layer may deteriorate.

On the other hand, when only zinc as a p-type dopant is added into a crystal layer of a III–V group compound semiconductor, in order to realize an intended amount of addition, it is typically required to set the substrate temperature during the crystal growth process at a small value, as described previously. However, under such setting, it is likely that an impurity such as oxygen or water is introduced into the crystal layer, whereby the electrical and/or optical characteristics of the obtained p-type III–V group compound semiconductor crystal layer may deteriorate.

Furthermore, due to the mutual diffusion of Zn as a p-type dopant and Se as an n-type dopant, the Zn-doped layer, which should be of the p-type, may not always be of the p-type; i.e., conductivity type inversion may occur. For example, in the structure illustrated in FIG. 2, the p-type first cladding layer 25 may be inverted to the n-type, whereby the n-type cladding layer 23 and the n-type current blocking layer 26 may be short-circuited with each other. Alternatively, a portion of the n-type cladding layer 23 directly beneath the stripe-shaped portion 17, in the vicinity of the active layer 24, may be inverted to the p-type, whereby an increase in the operating current (a decrease in reliability) may occur.

In order to suppress such mutual diffusion, Si may be used instead of Se as an n-type dopant. Si is a dopant which is typically less likely to diffuse and has an effect of suppressing diffusion of a p-type dopant at the p-n interface into the n-type layer. However, such an effect of suppressing the p-type dopant diffusion into the n-type layer may contrarily lower the operating characteristics of the produced light emitting device.

In particular, when the n-type dopant in the structure illustrated in FIG. 2 is Se exhibiting no diffusion suppressing effect, due to the diffusion of Zn as a p-type dopant added to the p-type cladding layer 25, the carrier concentration of the p-type cladding layer 25 in regions beneath the current blocking layer 26 becomes lower than that in another region beneath the stripe-shaped portion 17. On the other hand, when Si is used in stead of Se as an n-type dopant, Si remains in the n-type cladding layer 23 and the n-type current blocking layer 26, and Zn as a p-type dopant added to the p-type cladding layer 25, except for a small amount thereof diffusing into the active layer 24, remains in the p-type cladding layer 25 due to the diffusion suppressing effect of Si. As a result, the carrier concentration of the p-type cladding layer 25 is substantially the same in the region beneath the stripe-shaped portion 17 and in the region beneath the current blocking layer 26. Therefore, the resistance of the p-type cladding layer 25 decreases while the leakage current increase, whereby there occurs a problem of a large operating current.

As described above, in accordance with the conventional techniques, it is not possible to reliably suppress diffusion of dopants contained in the respective compound semiconductor layers of the III–V group compound semiconductor light emitting device. Therefore, it is difficult to reliably control the dopant concentration or the conductivity type of the respective layers, whereby the operating characteristics of the resultant light emitting device may deteriorate.

SUMMARY OF THE INVENTION

A light emitting device of the present invention includes: a plurality of n-type III–V group compound semiconductor layers; a plurality of p-type III–V group compound semiconductor layers; and an active layer, wherein carbon atoms and II-group element atoms are both added to at least one of the plurality of p-type III–V group compound semiconductor layers.

Preferably, a ratio ([C]/[II-group element]) between a concentration of the carbon atoms [C] and a concentration of the II-group element atoms [II-group element], which are both added to the p-type III–V group compound semiconductor layer, is in a range between about 1 and about 10.

The p-type III–V group compound semiconductor layer, to which the carbon atoms and the II-group element atoms are both added, may be in contact with at least one of the plurality of n-type III–V group compound semiconductor layers.

The p-type III–V group compound semiconductor layer, to which the carbon atoms and the II-group element atoms are both added, may be in contact with the active layer.

Another aspect of the present invention provides a method for producing a semiconductor light emitting device. The method includes the step of growing a layered structure on a surface of a substrate. The layered structure at least includes a plurality of n-type III–V group compound semiconductor layers, a plurality of p-type III–V group compound semiconductor layers, and an active layer. Carbon atoms and II-group element atoms are both added when growing at least one layer of the plurality of p-type III–V group compound semiconductor layers.

Another semiconductor light emitting device of the present invention includes: a plurality of n-type III–V group compound semiconductor layers; a plurality of p-type III–V group compound semiconductor layers; and an active layer, wherein carbon atoms and Si atoms are both added to at least one of the plurality of n-type III–V group compound semiconductor layers.

The n-type III–V group compound semiconductor layer, to which the carbon atoms and the Si atoms are both added, may be in contact with at least one of the plurality of p-type III–V group compound semiconductor layers.

Still another aspect of the present invention provides another method for producing a semiconductor light emitting device. The method includes the step of growing a layered structure on a surface of a substrate. The layered structure at least includes a plurality of n-type III–V group compound semiconductor layers, a plurality of p-type III–V group compound semiconductor layers, and an active layer. Carbon atoms and Si atoms are both added when growing at least one layer of the plurality of n-type III–V group compound semiconductor layers.

Still another semiconductor light emitting device of the present invention includes: an n-type substrate; a double hetero junction structure formed on the n-type substrate, the double hetero junction structure at least including a Si-doped n-type cladding layer, an active layer, and a Zn-doped p-type first cladding layer; and a current blocking structure formed on the double hetero junction structure. The current blocking structure at least includes an n-type current blocking layer and a second p-type cladding layer. The n-type current blocking layer includes: a Se-doped n-type first current blocking layer adjacent to the Zn-doped p-type first cladding layer; and a Si-doped n-type second current blocking layer formed on the n-type first current blocking layer.

In one embodiment, in the current blocking structure, the n-type current blocking layer has a stripe-shaped groove, and the p-type second cladding layer is formed so as to cover the groove and the n-type current blocking layer.

In another embodiment, in the current blocking structure, the p-type second cladding layer has a striped ridge shape, and the n-type current blocking layer is provided on both sides of the ridge shape.

Preferably, an amount of Zn, which is represented as a product of a preset Zn concentration in the p-type first cladding layer and a thickness of the p-type first cladding layer, is equal to or greater than an amount of Se, which is represented as a product of a preset Se concentration in the n-type first current blocking layer and a thickness of the n-type first current blocking layer.

The p-type second cladding layer and the n-type current blocking layer may be layers which are regrown by an MOCVD method or an LPE method.

Thus, the invention described herein makes possible the advantages of: (1) providing a semiconductor light emitting device with satisfactory operating characteristics by reliably suppressing diffusion of dopants contained in the respective compound semiconductor layers of the semiconductor light emitting device to reliably control the dopant concentration or the conductivity type of the respective layers ; and (2) providing a method for producing such a semiconductor light emitting device.

These and other advantages of the present invention will become apparent to those skilled in the art upon reading and understanding the following detailed description with reference to the accompanying figures.

DESCRIPTION OF THE PREFERRED EMBODIMENTS

EXAMPLE 1

Hereinafter, a semiconductor light emitting device (semiconductor laser device) which is produced using both Zn and carbon as p-type dopants will be described as Example 1 of the present invention.

Figure 4:
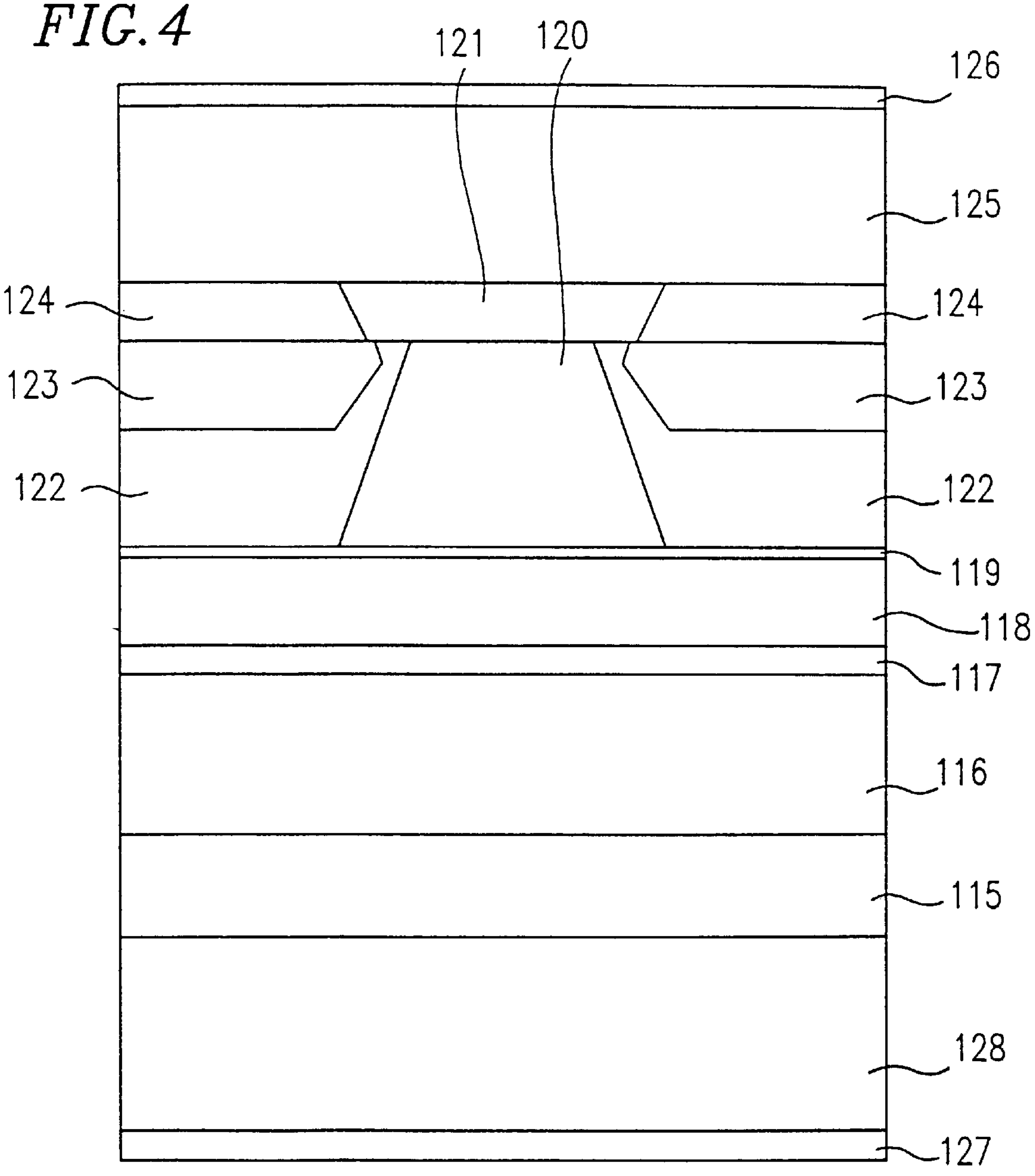
FIG. 4 is a cross-sectional view illustrating a structure of a semiconductor light emitting device according to Example 1 of the present invention.

FIG. 4 is a cross-sectional view illustrating a structure of a semiconductor laser device according to Example 1 of the present invention.

In the cross-sectional view of FIG. 4, an n-type GaAs buffer layer 115, an n-type AlGaAs cladding layer 116, an AlGaAs active layer 117, a p-type AlGaAs first cladding layer 118, a p-type GaAs etching stop layer 119, a p-type AlGaAs second cladding layer 120 and a p-type GaAs protective layer 121 are deposited in this order on an n-type GaAs substrate 128, thereby forming a layered structure.

In this layered structure, the layers above the p-type GaAs etching stop layer 119 form a stripe-shaped mesa structure (a mesa stripe). An n-type AlGaAs current blocking layer 122, an n-type GaAs current blocking layer 123 and a p-type GaAs planarizing layer 124 are buried on both sides of the mesa stripe. Thus, a current blocking structure for constricting a current into the mesa stripe portion is formed.

Moreover, a p-type GaAs contact layer 125 is formed on the p-type GaAs protective layer 121 and the p-type GaAs planarizing layer 124. A p-side metal electrode 126 and an n-side metal electrode 127 are respectively formed on the p-type GaAs contact layer 125 and on the reverse surface of the n-type GaAs substrate 128 by, for example, a vapor deposition method.

The layers included in the semiconductor laser device illustrated in FIG. 4 may be grown by using the vapor deposition apparatus of a depressurized horizontal RF heating furnace type described above with reference to FIG. 3.

Figure 1:
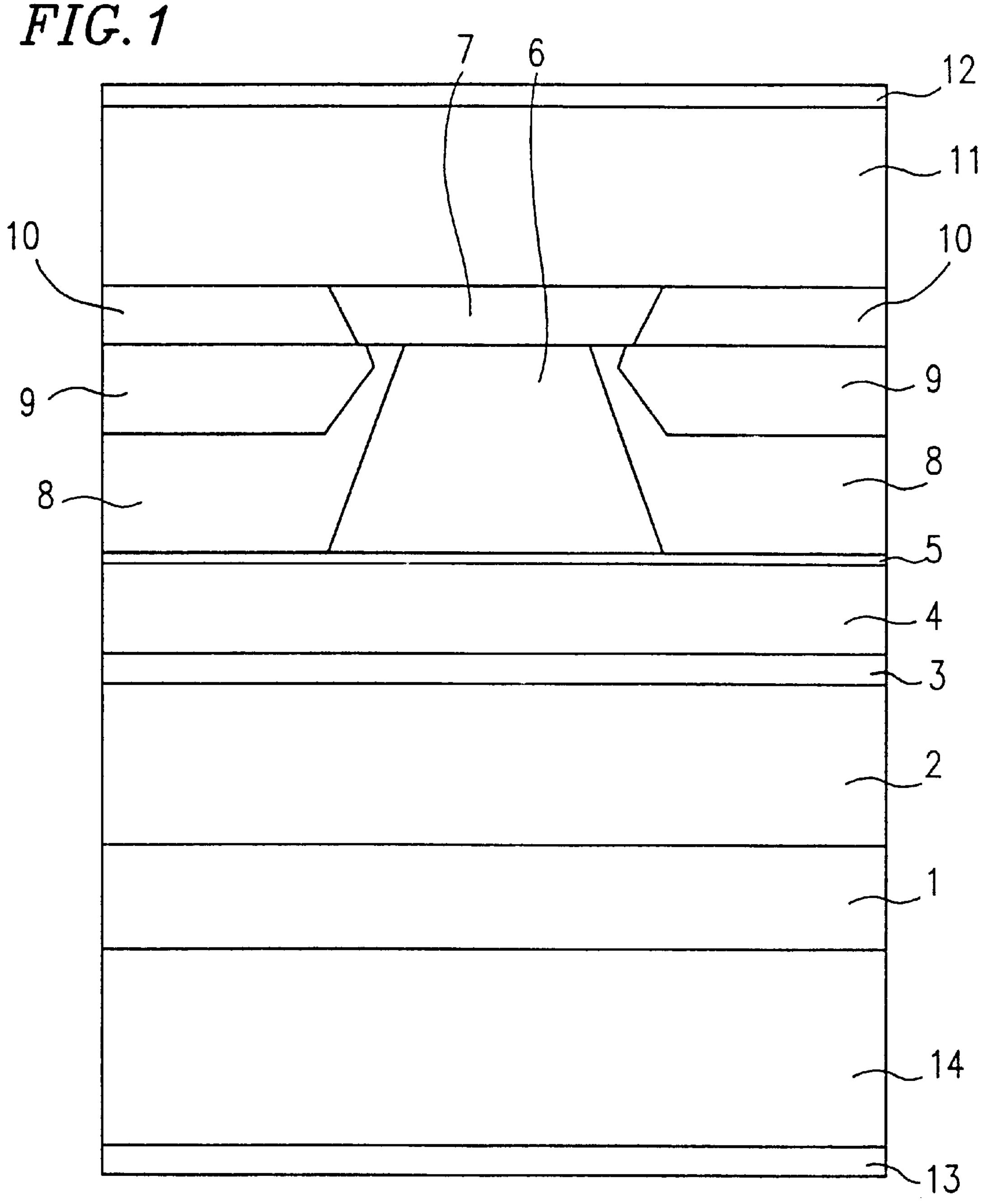
FIG. 1 is a cross-sectional view illustrating a typical structure of a III–V group compound semiconductor laser device produced by using the MOCVD method.
Figure 2:
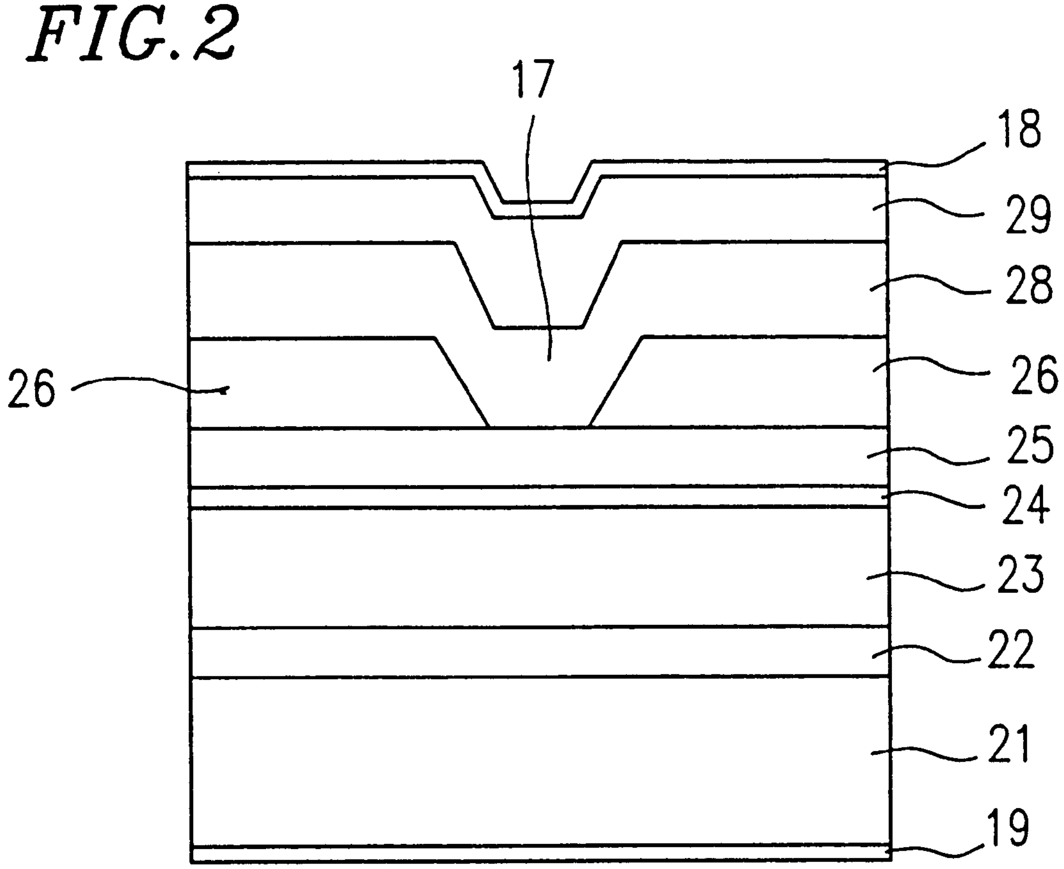
FIG. 2 is a cross-sectional view illustrating another typical structure of a III–V group compound semiconductor laser device produced by using the MOCVD method.
Figure 3:
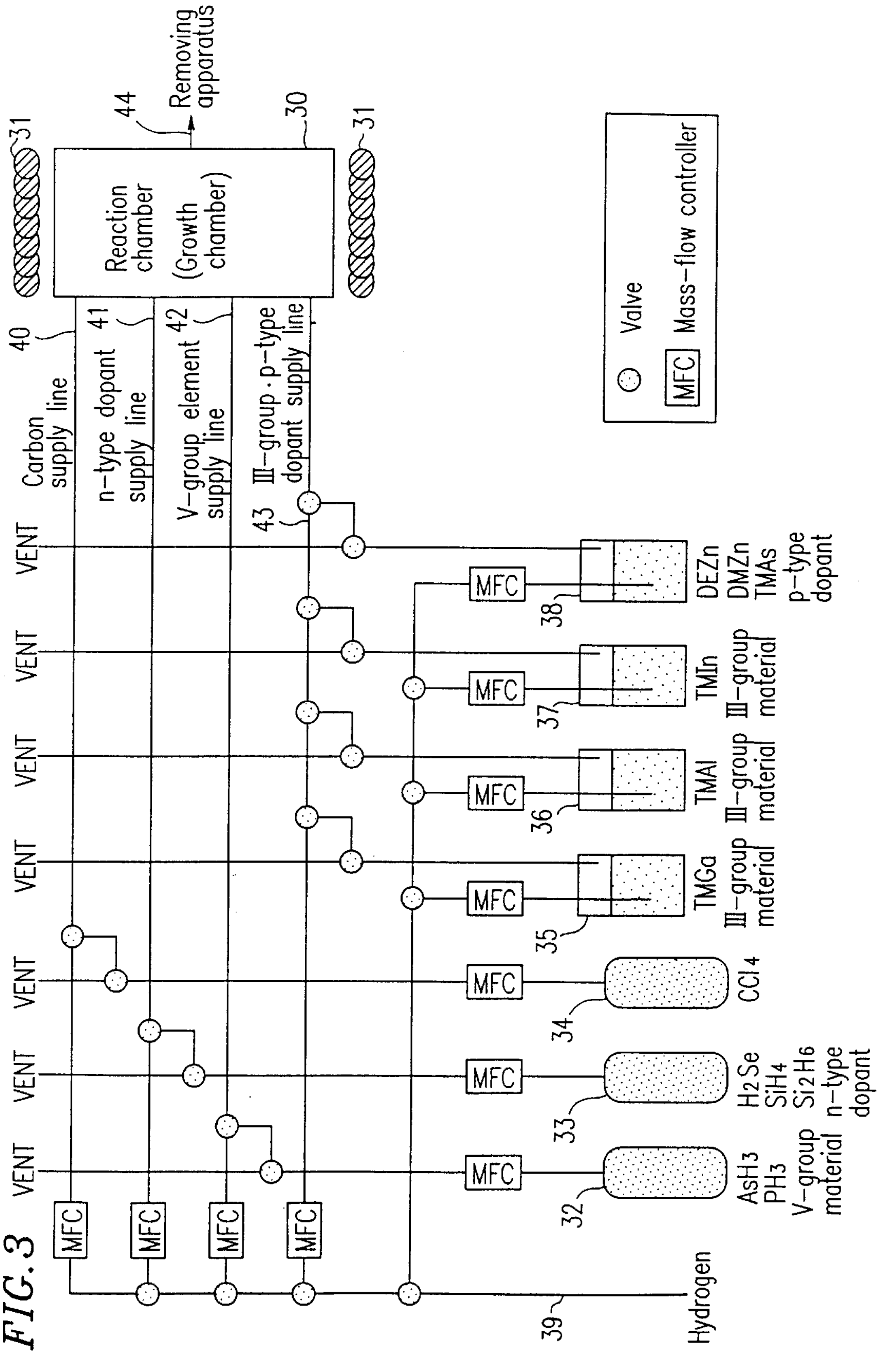
FIG. 3 is a diagram schematically illustrating a structure of a vapor deposition apparatus of a depressurized horizontal RF heating furnace type which can be used for growing the semiconductor layers included in the semiconductor laser device illustrated in FIG. 1 or 2.

In particular, in the apparatus illustrated in FIG. 3, trimethylgallium (TMGa) is used as a Ga material; trimethylaluminum (TMAl) as an Al material; arsine ($AsH_3$) as an As material; monosilane ($SiH_4$) as a Si material as an n-type dopant; diethylzinc (DEZn) as a Zn material, which is one of the p-type dopants; and trimethylarsenic (TMAs) as a carbon material, which is the other one of the p-type dopants. A substrate is placed inside the reaction chamber 30, the internal pressure of the reaction chamber 30 is set to about 76 Torr, and the substrate temperature is set to about 700° C. using the RF coil 31. Then, the mass flow controllers (MFCs) and the valves are appropriately controlled so as to set the ratio (V/III ratio) between the amount of supply of the material compound containing the III-group material (i.e., the amount of supply of TMGa, or the total amount of supply of TMGa and that of TMAl) and the amount of supply of the material compound containing the V-group element (i.e., the total amount of supply of $AsH_3$ and that of TMAs) to about 60. Then, the crystal growth process of the respective layers proceeds while the above-described conditions are kept constant during the process.

For example, when growing the n-type GaAs buffer layer 115 and the n-type GaAs current blocking layer 123, TMGa, $AsH_3$ and $SiH_4$ are supplied onto the substrate. When forming n-type AlGaAs cladding layer 116 and the n-type AlGaAs current blocking layer 122, TMGa, TMAl, $AsH_3$ and $SiH_4$ are supplied onto the substrate. When forming the AlGaAs active layer 117, TMGa, TMAl and $AsH_3$ are supplied onto the substrate. When forming the p-type GaAs contact layer 125, TMGa, $AsH_3$ and DEZn are supplied onto the substrate. Moreover, when growing the p-type GaAs etching stop layer 119, the p-type GaAs protective layer 121 and the p-type GaAs planarizing layer 124, TMGa, $ASH_3$, DEZn and TMAs are supplied onto the substrate. When growing the p-type AlGaAs first cladding layer 118 and the p-type AlGaAs second cladding layer 120, TMGa, TMAl, $AsH_3$, DEZn and TMAs are supplied onto the substrate.

In this way, Zn, as a II-group element atom, and carbon are both added as p-type dopants to the layers 118 to 121 and 124 formed of p-type GaAs or p-type AlGaAs, which are adjacent to the n-type AlGaAs current blocking layer 122 and the n-type GaAs current blocking layer 123.

The amount of carbon added to the respective layers is controlled by setting the V/III ratio. Moreover, TMAs is used as the carbon material compound in the above description. However, in practice, even when the TMAs supply is omitted, the carbon addition may also be realized due to decomposition of the other material compounds.

Figure 5:
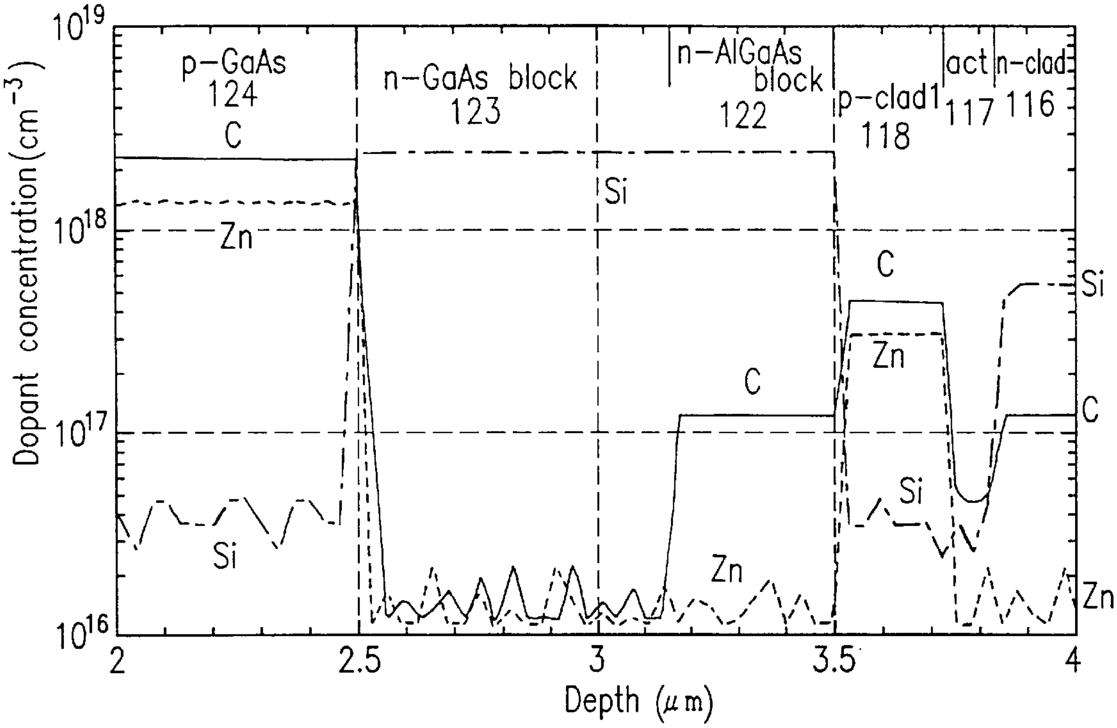
FIG. 5 illustrates secondary ion mass spectrometry (SIMS) profiles for concentrations of n-type and p-type dopants in the current blocking structure of the semiconductor light emitting device illustrated in FIG. 4.
Figure 6:
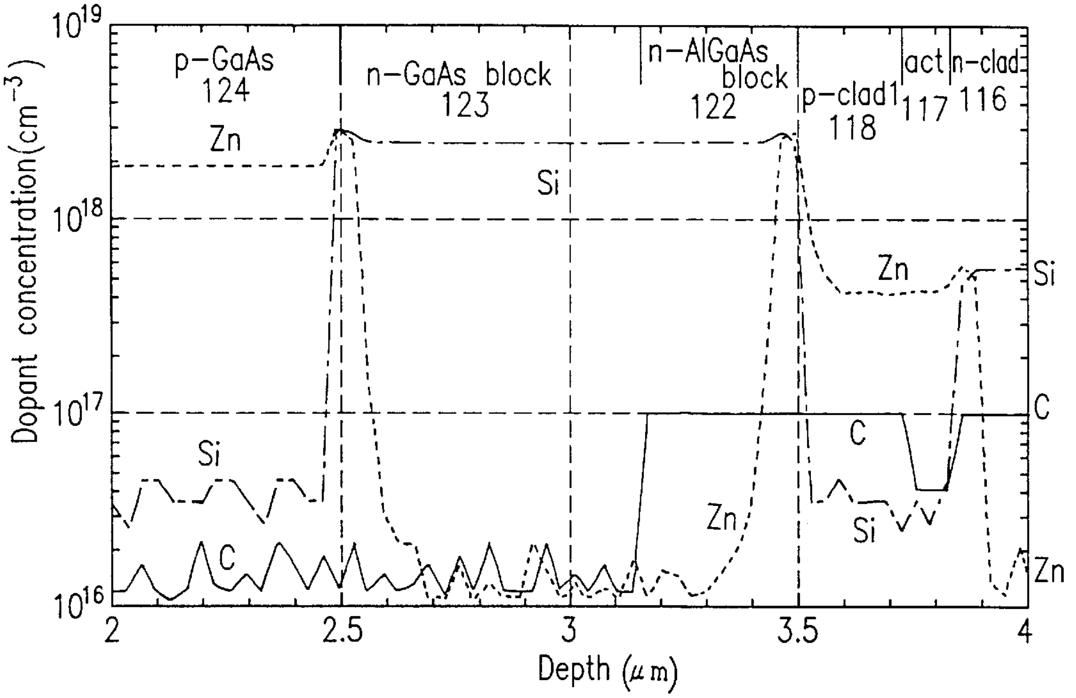
FIG. 6 illustrates secondary ion mass spectrometry (SIMS) profiles for concentrations of n-type and p-type dopants in a device which is produced so that only Zn is added to the respective layers formed of p-type GaAs and AlGaAs in the same structure as that of the semiconductor light emitting device illustrated in FIG. 4.
Figure 7:
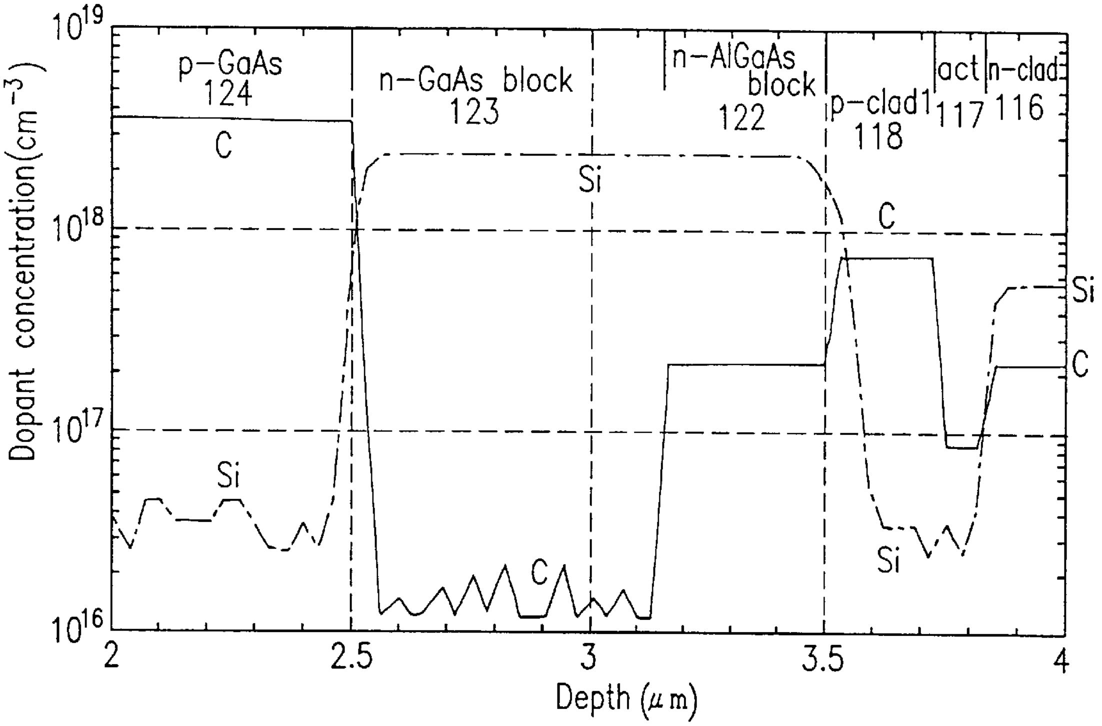
FIG. 7 illustrates secondary ion mass spectrometry (SIMS) profiles for concentrations of n-type and p-type dopants in a device which is produced so that only carbon is added to the respective layers formed of p-type GaAs and AlGaAs in the same structure as that of the semiconductor light emitting device illustrated in FIG. 4.

FIG. 5 illustrates the secondary ion mass spectrometry (SIMS) profiles for concentrations of the n-type and p-type dopants in the current blocking structure of the semiconductor laser device produced as described above in accordance with the present example. FIG. 6 illustrates, as a comparative example, the SIMS profiles for a device which is obtained by performing a crystal growth process while reducing the substrate temperature to about 600° C. so that only Zn is added to the respective layers formed of p-type GaAs or p-type AlGaAs in the same structure as that of the present example. Moreover, FIG. 7 illustrates the SIMS profiles for a device which is obtained by performing a crystal growth process while reducing the V/III ratio to about 2 so that only carbon is added to the respective layers formed of p-type GaAs or p-type AlGaAs in the same structure as that of the present example. In FIGS. 5 to 7, the horizontal axis represents the depth from the surface of the grown layered structure, while the vertical axis represents the concentrations of carbon (C) and zinc (Zn) as p-type dopants and silicon (Si) as an n-type dopant.

Comparison between FIGS. 5 and 6 shows the following. In FIG. 6 where only Zn is added, Zn diffuses into the n-type cladding layer 116 and the n-type current blocking layers 122 and 123, whereby the dopant concentration (carrier concentration) in the p-type AlGaAs first cladding layer 118 is lower than the predetermined value (about $8\times10^{17}$ $cm^{-3}$). In contrast, in FIG. 5 where Zn and carbon are both used, such diffusion of Zn is not caused, whereby the dopant concentration (carrier concentration) is accurately controlled.

Comparison between FIGS. 5 and 7 shows the following. In FIG. 7 where only carbon is added, Si diffuses into the p-type AlGaAs first cladding layer 118, whereby a portion of the p-type AlGaAs first cladding layer 118 in the vicinity of the p-n interface is inverted to n-type. In contrast, in FIG. 5 where Zn and carbon are both used, such diffusion of Si or the p-type to n-type inversion associated therewith is not caused.

The carrier concentration of the semiconductor laser device of the present example, which exhibits the concentration profile as illustrated in FIG. 5, was determined by a C-V measurement. The result confirmed that the predetermined value (about $8\times10^{17}$ $cm^{-3}$) was obtained.

According to a further study done by the present inventors, when the growth temperature (i.e., the substrate temperature during the crystal growth process) is set to about 670° C. or higher while setting the V/III ratio to about 20 or higher, contamination of oxygen into the p-type AlGaAs layer is not detected by the SIMS measurement. In other words, the amount of oxygen contamination into the p-type AlGaAs layer in the semiconductor laser device of the present example is planarizing reduced compared to that of the conventional techniques.

Hereinafter, the result of a study on the optimal amount of carbon and Zn added as p-type dopants in the above-described process will be described.

In particular, in the apparatus illustrated in FIG. 3, a substrate is placed inside the reaction chamber (growth chamber) 30, the internal pressure of the reaction chamber 30 is set to about 76 Torr, and the substrate temperature is set to about 700° C. using the RF coil 31, as described above. Then, the crystal growth process of the layers is performed under the following two conditions, while the amount of supply of the material compound containing the III-group material (i.e., the amount of supply of TMGa, or the total amount of supply of TMGa and that of TMAl) is kept constant by appropriately controlling the mass flow controllers (MFCs) and the valves. In the first condition, the V/III ratio is set so that the ratio ([C]/[Zn]) between the carbon atom concentration [C] and the zinc atom concentration [Zn] is less than 1 in the layers 118 to 121 and 124 formed of p-type GaAs or p-type AlGaAs, which are adjacent to the n-type AlGaAs current blocking layer 122 and the n-type GaAs current blocking layer 123. In the second condition, the V/III ratio is set so that the above ratio ([C]/[Zn]) is 1 or greater. Under such conditions, the layers are grown while adding both Zn, as a II-group element atom, and carbon.

Figure 8:
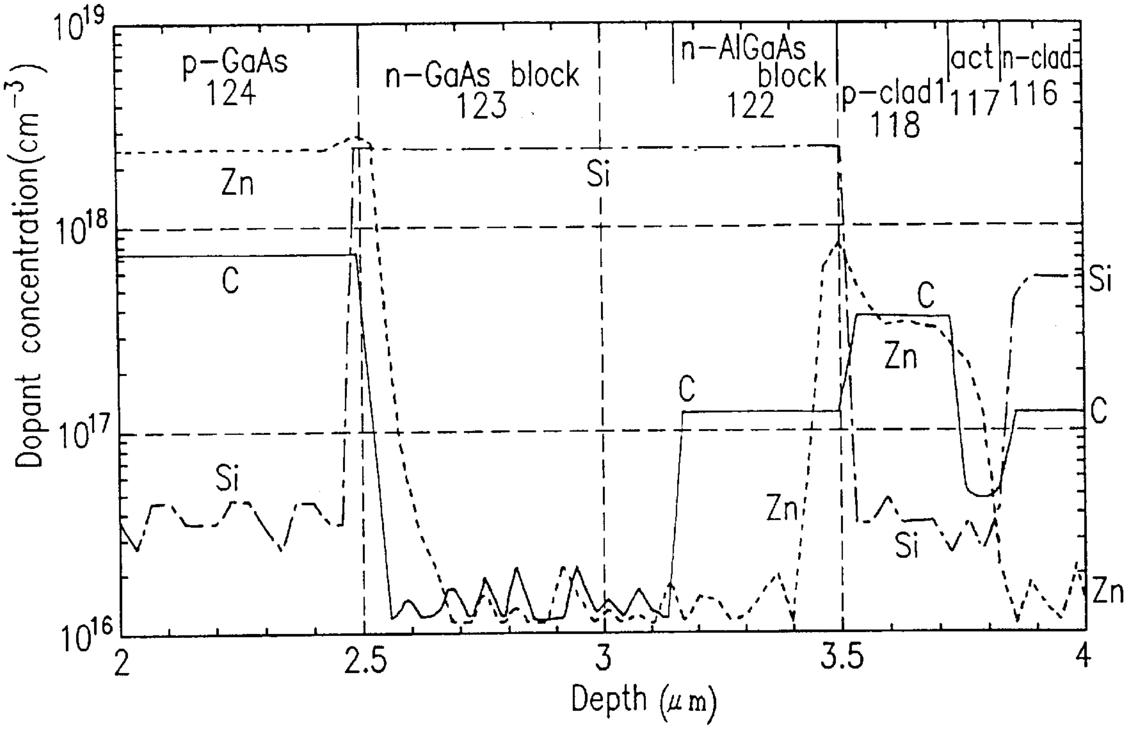
FIG. 8 illustrates secondary ion mass spectrometry (SIMS) profiles for concentrations of n-type and p-type dopants in a device which is produced so that the ratio ([C]/[Zn]) between the carbon atom concentration [C] and the zinc atom concentration [Zn] is less than 1 in the respective layers formed of p-type GaAs and AlGaAs in the same structure as that of the semiconductor light emitting device illustrated in FIG. 4.
Figure 9:
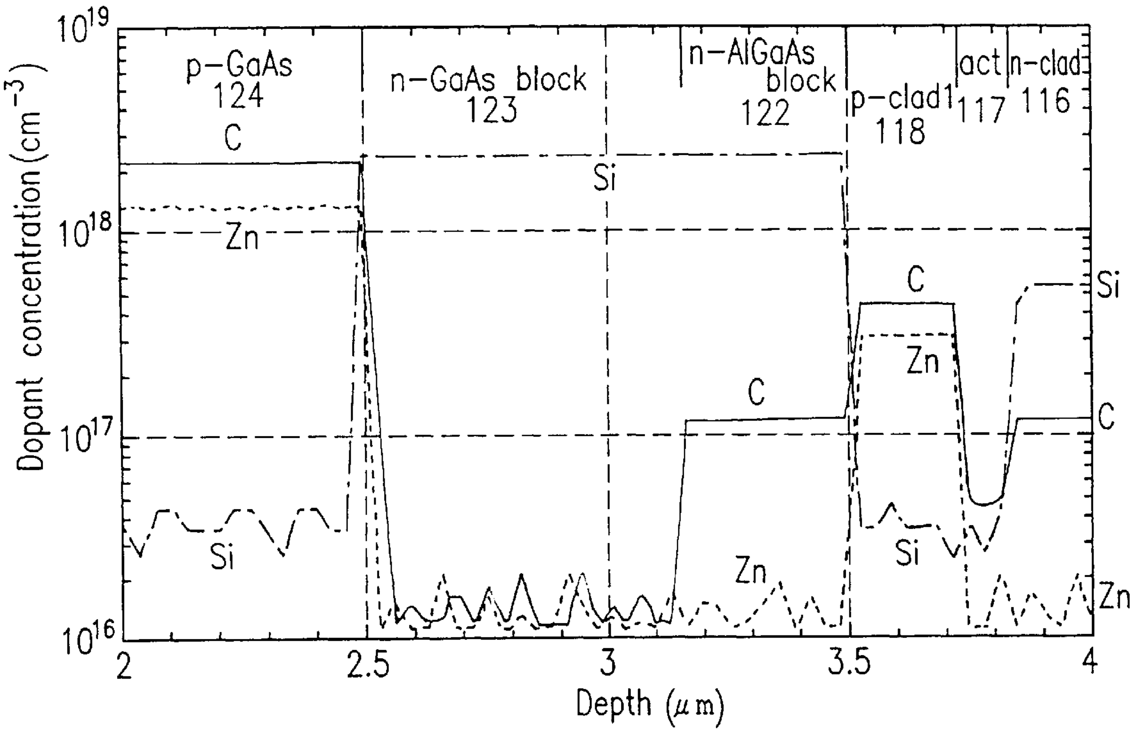
FIG. 9 illustrates secondary ion mass spectrometry (SIMS) profiles for concentrations of n-type and p-type dopants in a device which is produced so that the ratio ([C]/[Zn]) between the carbon atom concentration [C] and the zinc atom concentration [Zn] is 1 or greater in the respective layers formed of p-type GaAs and AlGaAs in the same structure as that of the semiconductor light emitting device illustrated in FIG. 4.

FIGS. 8 and 9 illustrate the secondary ion mass spectrometry (SIMS) profiles for concentrations of the n-type and p-type dopants in the current blocking structure of the semiconductor laser device produced under the first and second conditions, respectively. In FIGS. 8 and 9, the horizontal axis represents the depth from the surface of the grown layered structure, while the vertical axis represents the concentrations of carbon (C) and zinc (Zn) as p-type dopants and silicon (Si) as an n-type dopant.

Comparison between FIGS. 8 and 9 shows the following. In FIG. 8 illustrating the results under the first condition (i.e., [C]/[Zn] <1), Zn diffuses into the n-type current blocking layers 122 and 123, whereby the dopant concentration (carrier concentration) in the p-type AlGaAs first cladding layer 118 is lower than the predetermined value (about $8\times10^{17}$ $cm^{-3}$). In contrast, in FIG. 9 illustrating the results under the second condition (i.e., [C]/[Zn] ≧1), such diffusion of Zn is not caused, whereby the dopant concentration (carrier concentration) is accurately controlled.

As the further experiments under the second condition, crystal growth processes are performed at different [C]/[Zn] ratios by setting the dopant concentration (carrier concentration) in the p-type AlGaAs first cladding layer 118 to a constant value (about $8\times10^{17}$ $cm^{-3}$) while varying the zinc atom concentration [Zn] to about $3.5\times10^{17}$ $cm^{-3}$, about $1.5\times10^{17}$ $cm^{-17}$, about $7\times10^{16}$ $cm^{-3}$ and about $5\times10^{16}$ $cm^{-3}$. As a result, it is confirmed from the SIMS measurement that the diffusion of Si from the n-type current blocking layers 122 and 123 into the p-type AlGaAs first cladding layer 118 occurs only at the zinc atom concentration [Zn] of about $5\times10^{16}$ $cm^{-3}$.

As can be seen from the above description, it is preferable to set the [C]/[Zn] ratio within a range between about 1 to about 10 in order to suppress the undesirable diffusion of Zn and Si.

As described above, the semiconductor laser device of the present example in which Zn, as a II-group compound element atom, and carbon are both added as p-type dopants can be produced with high reproducibility, thereby planarizing increasing the production yield from that of the conventional techniques. Moreover, the semiconductor laser device of the present example stably operated over 5000 hours in a reliability test with an output of about 35 mW at about 60° C. Thus, a high quality and high reliability semiconductor laser device is obtained.

Effects comparable to the above also may be obtained when Se is used instead of Si as the n-type dopant. Moreover, effects comparable to the above may also be obtained when Mg or Be is used instead of Zn as the p-type dopant. Furthermore, the substrate temperature or the V/III ratio may be set to a value other than the above as long as it is kept constant during a crystal growth process.

EXAMPLE 2

Hereinafter, a semiconductor light emitting device (semiconductor laser device) which is produced using both Be and carbon as p-type dopants will be described as Example 2 of the present invention.

Figure 10:
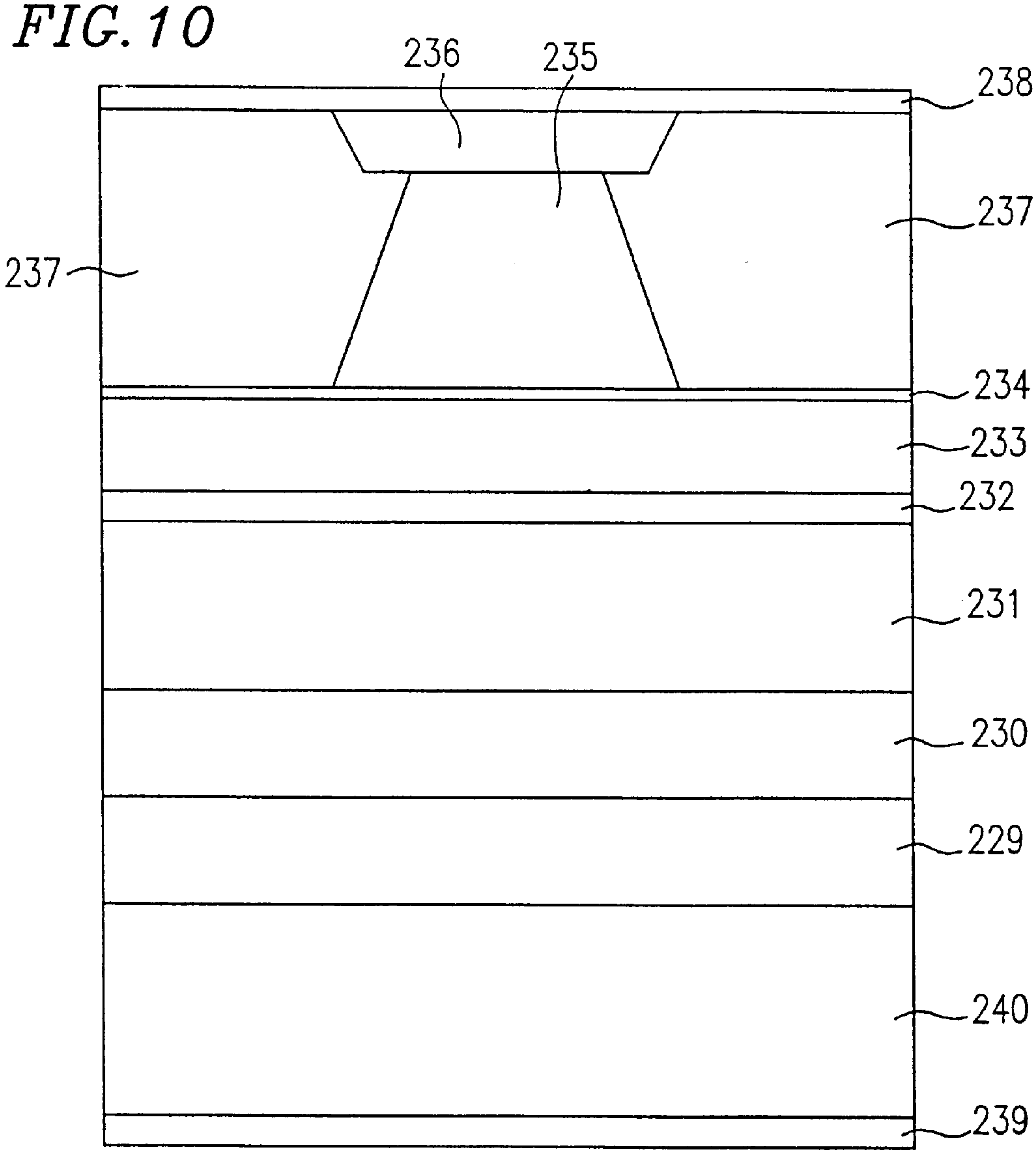
FIG. 10 is a cross-sectional view illustrating a structure of a semiconductor light emitting device according to Example 2 of the present invention.

FIG. 10 is a cross-sectional view illustrating a structure of a semiconductor laser device according to Example 2 of the present invention.

In the cross-sectional view of FIG. 10, an n-type GaAs buffer layer 229, an n-type GaInP buffer layer 230, an n-type AlGaInP cladding layer 231, a GaInP active layer 232, a p-type AlGaInP first cladding layer 233, a p-type GaInP etching stop layer 234, a p-type AlGaInP second cladding layer 235 and a p-type GaAs contact layer 236 are deposited in this order on an n-type GaAs substrate 240, thereby forming a layered structure.

In this layered structure, the layers above the p-type GaInP etching stop layer 234 form a stripe-shaped mesa structure (a mesa stripe). An n-type GaAs current blocking layer 237 is buried on both sides of the mesa stripe. Thus, a current blocking structure for constricting a current into the mesa stripe portion is formed.

Moreover, a p-side metal electrode 238 and an n-side metal electrode 239 are respectively formed on the p-type GaAs contact layer 236 and on the reverse surface of the n-type GaAs substrate 240 by, for example, a vapor deposition method.

The layers included in the semiconductor laser device illustrated in FIG. 10 may be grown by performing a crystal growth process using a known MBE apparatus while setting the substrate temperature to about 550° C.

For example, when growing the p-type AlGaInP first cladding layer 233 and the p-type AlGaInP second cladding layer 235, the substrate is irradiated with molecular beams of Ga, Al, In, P, Be and C. When growing the p-type GaInP etching stop layer 234, the substrate is irradiated with molecular beams of Ga, In, P, Be and C. Similarly, when growing the p-type GaAs contact layer 236, the substrate is irradiated with molecular beams of Ga, As, Be and C.

In this way, Be, as a II-group element atom, and carbon are both added as p-type dopants to the layers 233 to 236 formed of p-type GaAs, p-type AlGaInP or p-type GaInP, which are adjacent to the n-type GaAs current blocking layer 237.

The amount of carbon added to the respective layers is controlled by setting the V/III ratio (i.e., the ratio in the amount of molecular beam irradiation).

Figure 11:
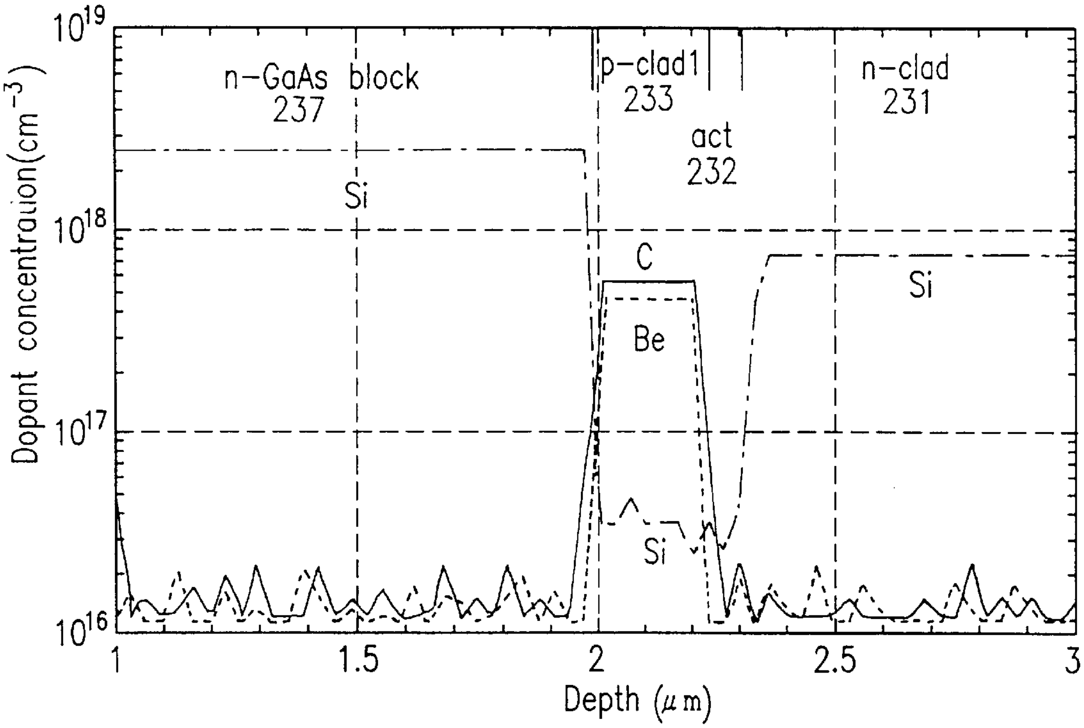
FIG. 11 illustrates secondary ion mass spectrometry (SIMS) profiles for concentrations of n-type and p-type dopants in the current blocking structure of the semiconductor light emitting device illustrated in FIG. 10.
Figure 12:
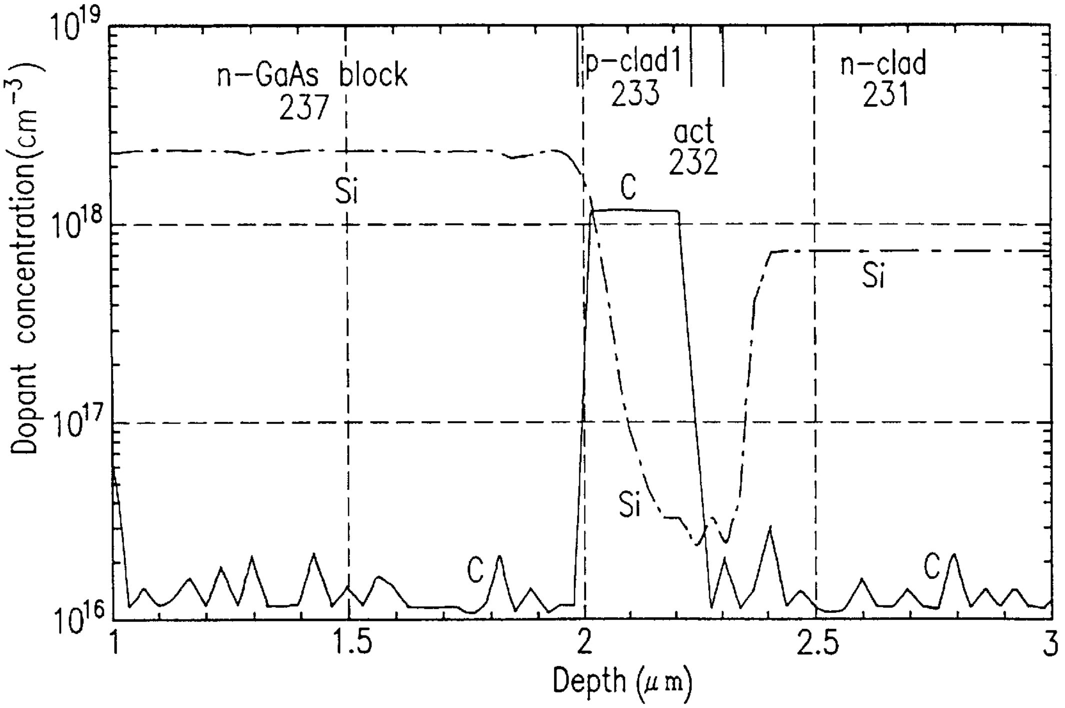
FIG. 12 illustrates secondary ion mass spectrometry (SIMS) profiles for concentrations of n-type and p-type dopants in a device which is produced so that only carbon is added to the respective layers formed of p-type GaAs and AlGaAs in the same structure as that of the semiconductor light emitting device illustrated in FIG. 10.
Figure 13:
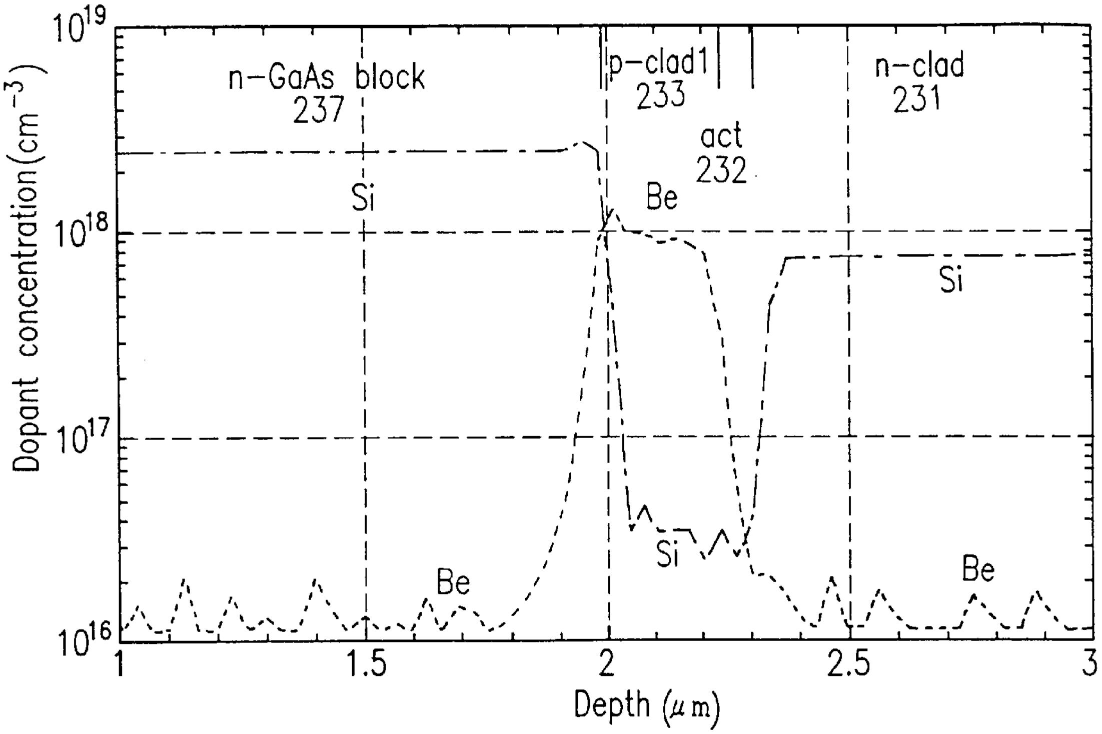
FIG. 13 illustrates secondary ion mass spectrometry (SIMS) profiles for concentrations of n-type and p-type dopants in a device which is produced so that only Be is added to the respective layers formed of p-type GaAs and AlGaAs in the same structure as that of the semiconductor light emitting device illustrated in FIG. 10.

FIG. 11 illustrates the secondary ion mass spectrometry (SIMS) profiles for concentrations of the n-type and p-type dopants in the current blocking structure of the semiconductor laser device produced as described above in accordance with the present example. FIGS. 12 and 13 each illustrate, as a comparative example, the SIMS profiles for a device which is obtained by a conventional technique where only carbon (as in FIG. 12) or Be (as in FIG. 13) is added to the respective layers formed of p-type GaAs, p-type AlGaInP or p-type GaInP in the same structure as that of the present example. In FIGS. 11 to 13, the horizontal axis represents the depth from the surface of the grown layered structure, while the vertical axis represents the concentrations of carbon (C) and beryllium (Be) as p-type dopants and silicon (Si) as an n-type dopant.

Comparison between FIGS. 11 and 12 shows the following. In FIG. 12 where only carbon is added, Si diffuses into the p-type AlGaInP first cladding layer 233, whereby a portion of the p-type AlGaInP first cladding layer 233 in the vicinity of the p-n interface is inverted to n-type. In contrast, in FIG. 11 where Be and carbon are both used, such diffusion of Si or the p-type to n-type inversion associated therewith is not caused.

Comparison between FIGS. 11 and 13 shows the following. In FIG. 13 where only Be is added, Be diffuses into the n-type cladding layer 231 and the n-type current blocking layer 237, whereby the dopant concentration (carrier concentration) in the p-type AlGaInP first cladding layer 233 is lower than the predetermined value (about $1\times10^{18}$ $cm^{-3}$). In contrast, in FIG. 11 where Be and carbon are both used, such diffusion of Be is not caused, whereby the dopant concentration (carrier concentration) is accurately controlled.

As described above, the semiconductor laser device of the present example in which Be, as a II-group compound element atom, and carbon are both added as p-type dopants can be produced with high reproducibility, thereby planarizing increasing the production yield from that of the conventional techniques. Moreover, the semiconductor laser device of the present example stably operated over 5000 hours in a reliability test with an output of about 5 mW at about 60° C. Thus, a high quality and high reliability semiconductor laser device is obtained.

EXAMPLE 3

Hereinafter, a semiconductor light emitting device (LED device) which is produced using both Zn and carbon as p-type dopants will be described as Example 3 of the present invention.

Figure 14:
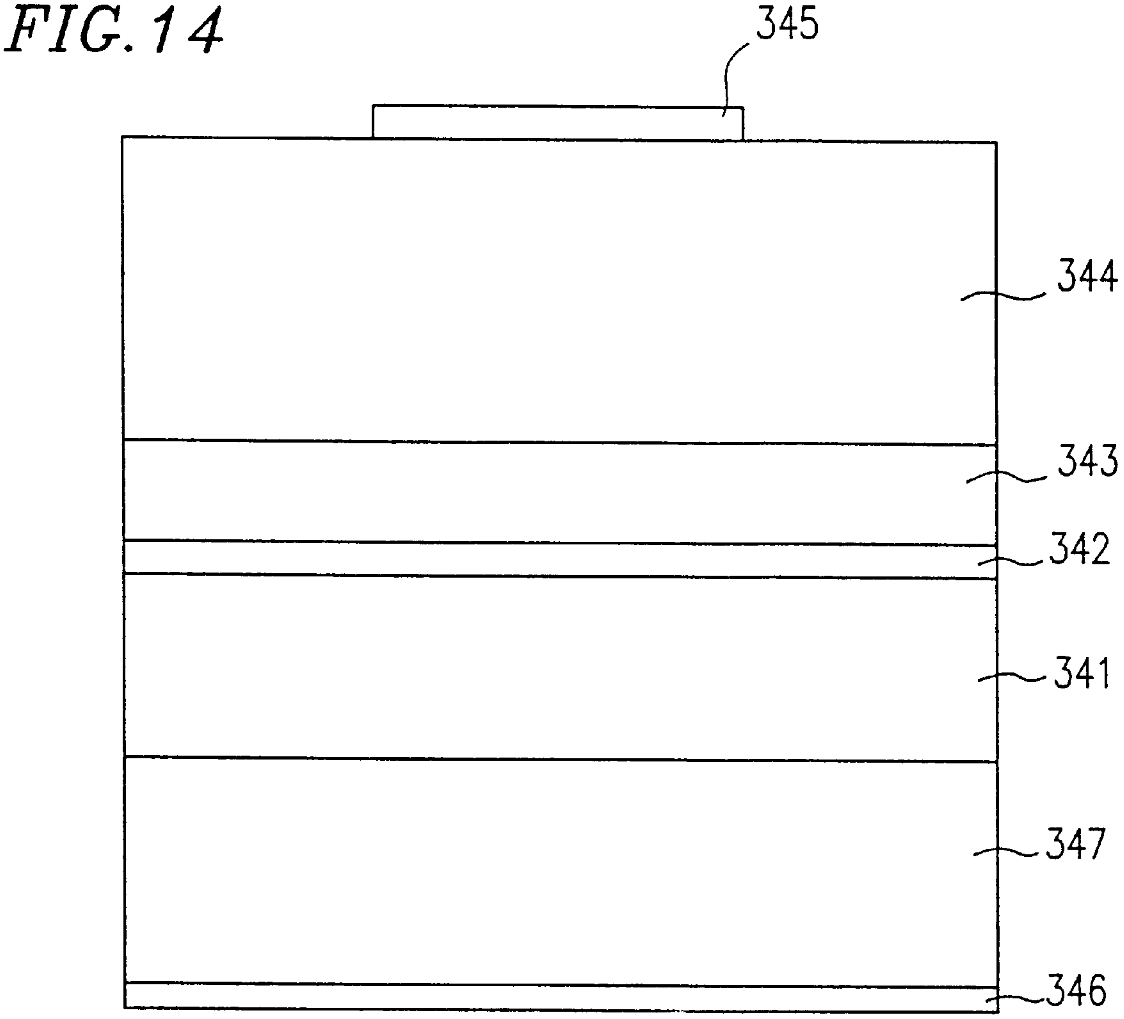
FIG. 14 is a cross-sectional view illustrating a structure of a semiconductor light emitting device according to Example 3 of the present invention.

FIG. 14 is a cross-sectional view illustrating a structure of an LED device according to Example 3 of the present invention.

In the cross-sectional view of FIG. 14, an n-type AlInP cladding layer 341, an AlGaInP active layer 342, a p-type AlInP cladding layer 343 and a p-type GaP current diffusion layer 344 are deposited in this order on an n-type GaAs substrate 347, thereby forming a layered structure. Moreover, a p-side metal electrode 345 having a predetermined pattern and an n-side metal electrode 346 are respectively formed on the p-type GaP current diffusion layer 344 and on the reverse surface of the n-type GaAs substrate 347 by, for example, a vapor deposition method.

The layers included in the LED device illustrated in FIG. 14 may be grown by using the vapor deposition apparatus of a depressurized horizontal RF heating furnace type described above with reference to FIG. 3.

In particular, in the apparatus illustrated in FIG. 3, trimethylgallium (TMGa) is used as a Ga material; trimethylaluminum (TMAl) as an Al material; trimethylindium(TMIn) as an In material; phosphine ($PH_3$) as a P material; monosilane ($SiH_4$) as a Si material as an n-type dopant; diethylzinc (DEZn) as a Zn material, which is one of the p-type dopants; and carbon tetrachloride ($CCl_4$) as a carbon material, which is the other one of the p-type dopants. A substrate is placed inside the reaction chamber (growth chamber) 30, the internal pressure of the reaction chamber 30 is set to about 76 Torr, and the substrate temperature is set to about 700° C. using the RF coil 31. Then, the mass flow controllers (MFCs) and the valves are appropriately controlled so as to set the ratio (V/III ratio) between the amount of supply of the material compound containing the III-group material (i.e., the amount of supply of TMGa, or the total amount of supply of TMGa, that of TMAl and that of TMIn) and the amount of supply of the material compound containing the V-group element (i.e., the amount of supply of $PH_3$) to a predetermined constant value. Then, the crystal growth process of the respective layers proceeds while the above-described conditions are kept constant during the process. For example, when growing the p-type AlInP cladding layer 343, TMAl, TMIn, $PH_3$, DEZn and $CCl_4$ are supplied onto the substrate.

In this way, Zn, as a II-group element atom, and carbon are both added as p-type dopants to the p-type AlInP cladding layer 343, which is adjacent to the n-type AlInP cladding layer 341.

For the LED device of the present example produced as described above and a device which is obtained by a conventional technique where only Zn is added to the p-type AlInP cladding layer 343 in the same structure as that of the present example, the concentrations of the n-type and p-type dopants were measured by the secondary ion mass spectrometry (SIMS). The results confirms that the amount of Zn diffused into the AlGaInP active layer 342 and the n-type AlInP cladding layer 341 is reduced in the device of the present example. Such reduction in the amount of diffusion remarkably improves the luminance of light emitted from the LED.

Thus, in accordance with the present example, an LED device exhibiting high quality and high luminance of the emitted light is obtained.

In accordance with the above-described Examples 1 to 3 of the present invention, in a III–V group compound semiconductor light emitting device having a plurality of n-type III–V group compound semiconductor layers and a plurality of p-type III–V group compound semiconductor layers, a II-group element atom such as Zn, Be, or the like, and carbon are both added as p-type dopants to at least one of the p-type III–V group compound semiconductor layers. Moreover, the ratio ([C]/[II-group element]) between the carbon atom concentration [C] and the II-group element concentration [II-group element] in the p-type III–V group compound semiconductor layer is preferably set within a range between about 1 to about 10. Thus, the II-group element atoms as a p-type dopant in the p-type layer combine with the n-type dopants in the n-type layer (e.g., Si or Se) at the p-n interface, thereby suppressing the diffusion of the n-type dopant or the p-type to n-type inversion associated therewith.

Such combining between the dopants may cause precipitation of the II-group element atoms at the p-n interface, whereby the II-group element concentration in the p-type layer decreases. However, carbon as the other p-type dopant is less likely to diffuse, it remains in the p-type layer, whereby a predetermined dopant concentration (carrier concentration) in the p-type layer is maintained. As a result, the operating characteristics of the produced semiconductor light emitting device such as a semiconductor laser device or an LED device are improved while the production yield thereof is also improved.

Furthermore, unlike the conventional techniques, it is not necessary to reduce the V/III ratio or the substrate temperature during the crystal growth process. Therefore, it is less likely that an impurity such as oxygen or water is introduced into the crystal growth layer, whereby a III–V group compound semiconductor crystal layer having satisfactory crystallinity would be grown on a crystal substrate. This also improves the operating characteristics of the produced semiconductor light emitting device, such as a semiconductor laser device or an LED device, and the production yield thereof.

EXAMPLE 4

In the above-described examples, carbon and a II-group element are both used as p-type dopants so as to control the p-type dopant. In the following Example 4, carbon is used for the purpose of controlling the n-type dopant.

Figure 15:
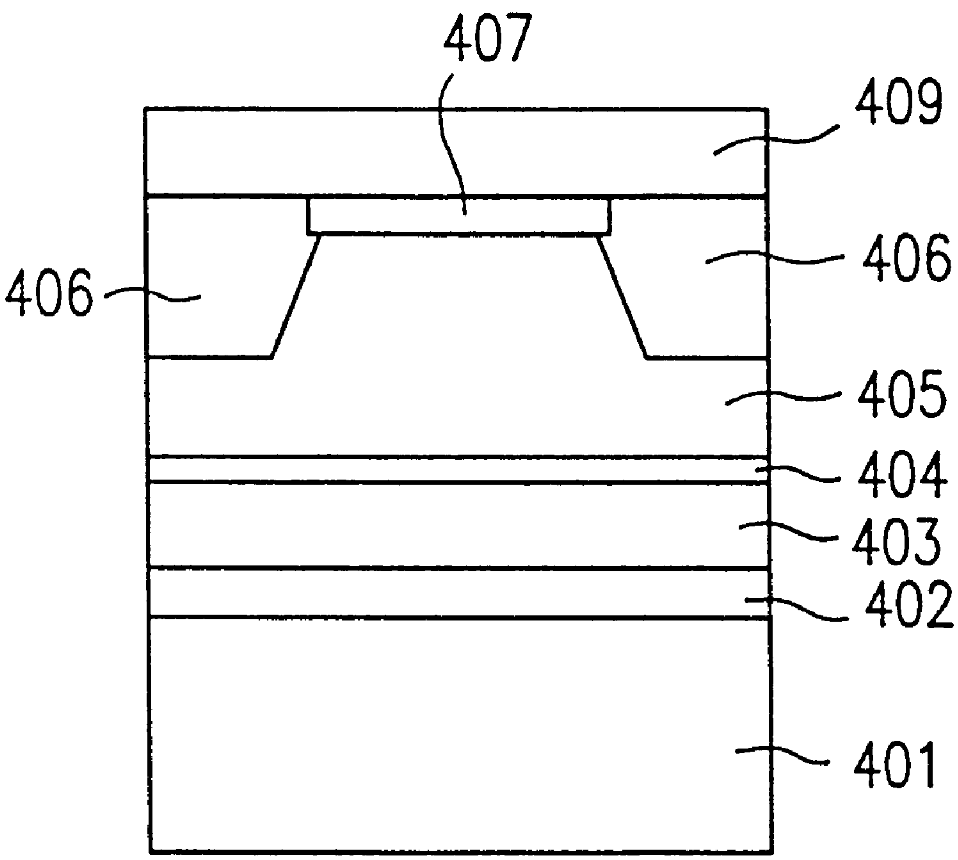
FIG. 15 is a cross-sectional view illustrating a structure of a semiconductor light emitting device according to Example 4 of the present invention.

FIG. 15 is a cross-sectional view illustrating a III–V group compound semiconductor laser device produced in accordance with the present example.

In the cross-sectional view of FIG. 15, an n-type GaAs buffer layer 402, an n-type $Al_{0.5}Ga_{0.5}As$ cladding layer 403, an undoped $Al_{0.15}Ga_{0.85}As$ active layer 404 and a p-type $Al_{0.5}Ga_{0.5}As$ cladding layer 405 are formed in this order on an n-type GaAs substrate 401. The p-type cladding layer 405 is formed so as to have a stripe-shaped convex portion on the upper side thereof, and an n-type GaAs current blocking layer 406 is buried on both sides of the stripe, thereby forming a current blocking structure where the striped portion functions as a current path.

A p-type GaAs intermediate layer 407 is formed on the striped portion, and a p-type GaAs contact layer 409 is further formed on the p-type GaAs intermediate layer 407 and the n-type GaAs current blocking layer 406. The p-side and n-side electrodes are omitted in FIG. 15. Moreover, the formation of the p-type GaAs intermediate layer 407 may be omitted.

The relationship among the composition ratios of the respective layers may be generalized as follows. An $Al_xGa_{1-x}As$ cladding layer of the first conductivity type, an $Al_yGa_{1-y}As$ active layer, an $Al_xGa_{1-x}As$ cladding layer of the second conductivity type and an $Al_zGa_{1-z}As$ current blocking layer of the first conductivity type are formed so that the mole fractions of x, y and z representing the AlAs-GaAs crystal ratio satisfy the relationship: $x>y\geqq 0$ and $z\geqq 0$; or $z>x>y\geqq 0$.

When producing a semiconductor laser device having the above structure, in accordance with the present example, carbon, as well as Si as an n-type dopant, is added in the growth process of an n-type layer.

The present inventors conducted a detailed study on the diffusion phenomenon of the p-type dopant which makes it difficult to control the conductivity type of the p-type layer in a double hetero (DH) junction structure formed of p-type and n-type cladding layers and an active layer. As a result, the present inventors have found that the diffusion of the p-type dopant is associated with the presence of interstitial Ga atoms in the base crystal and that the interstitial Ga atoms can be reduced by using Si as an n-type dopant which occupies the III-group site, thereby reducing the diffusion of the p-type dopant.

However, a Si atom is an amphoteric, and it can be introduced into the V-group site, instead of the III-group site, thereby exhibiting the reverse conductivity type. In view of this, the present inventors made an attempt to prevent the Si atoms from being introduced into the V-group site and thus exhibiting the reverse conductivity type, by supplying carbon, which is introduced only into the V-group site, along with Si with high controllability in a growth process of the n-type layer. As a result, it was confirmed that Si atoms were efficiently supplied to the III-group site, thereby exhibiting the intended conductivity type. Thus, it is possible to stably produce a semiconductor laser device (semiconductor light emitting device) with high reliability.

For simultaneously supplying carbon for such a purpose, in accordance with the present example, the substrate temperature during the crystal growth process is set to about 700° C. to about 800° C. (typically, about 700° C.), while the V/III ratio is set to about 20 to about 500 (typically, about 120). Particularly, by controlling the V/III ratio, the carbon addition concentration is substantially linearly controlled, whereby the carbon addition concentration increases as the V/III ratio is reduced. This is done by, for example, maintaining the supplied amount of the material compound containing the III-group element at a constant value while varying the supplied amount of the material compound containing the V-group element.

The carbon addition concentration in the formation of the n-type layer, may be of any value which does not exceed the predetermined n-type dopant concentration (carrier concentration). More particularly, when the carbon addition concentration is about $1\times10^{15}$ $cm^{-3}$ to about $1\times10^{18}$ $cm^{-3}$, Si atoms may be efficiently introduced into the III-group sites within an atom concentration range between about $1\times10^{16}$ $cm^{-3}$ and about $2\times10^{18}$ $cm^{-3}$.

In the structure illustrated in FIG. 15, an electric current is injected through the p-type GaAs contact layer 409, and flows through the striped portion of the p-type $Al_{0.5}Ga_{0.5}As$ cladding layer 405 due to the presence of the n-type GaAs current blocking layer 406, thereby flowing in a concentrated manner into a region of the $Al_{0.15}Ga_{0.85}As$ active layer 404 beneath the striped portion and generating laser oscillation in that region. Although the refractive index of the n-type GaAs current blocking layer 406 is greater than that of the p-type $Al_{0.5}Ga_{0.5}As$ cladding layer 405, the bandgap value of the n-type GaAs current blocking layer 406 is less than that of the $Al_{0.15}Ga_{0.85}As$ active layer 404, whereby the n-type GaAs current blocking layer 406 absorbs light. Therefore, the generated laser light is stably confined in a region in the vicinity of the striped portion of the p-type AlGaAs cladding layer 405 due to the light absorption by the n-type GaAs current blocking layer 406. By setting the stripe width to about 4 μm to about 5 μm, it is possible to obtain a single transverse mode and to obtain a semiconductor laser device with excellent reliability and stability.

Next, a method for producing the semiconductor laser device of the present example will be described with reference to the cross-sectional views of FIGS. 16A to 16D.

Figure 16A:
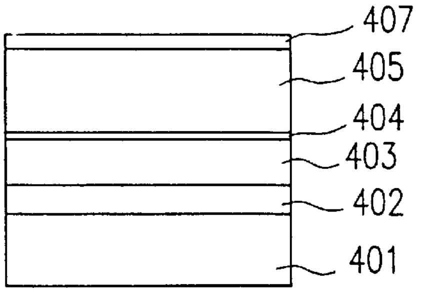
FIGS. 16A to 16D are cross-sectional views each illustrating a production process of a semiconductor light emitting device illustrated in FIG. 15.

First, as illustrated in FIG. 16A, the n-type buffer layer 402 (thickness: about 0.5 μm), the n-type $Al_{0.5}Ga_{0.5}As$ cladding layer 403 (thickness: about 1.0 μm), the undoped $Al_{0.15}Ga_{0.85}As$ active layer 404 (thickness: about 0.08 μm), the p-type $Al_{0.5}Ga_{0.5}As$ cladding layer 405 (thickness: about 1.0 μm) and the intermediate layer 407 (thickness: about 0.025 μm) formed of p-type $Al_{0.06}Ga_{0.94}As$ or p-type GaAs are formed in this order on the n-type GaAs substrate 401 by the MOCVD method.

Figure 16B:
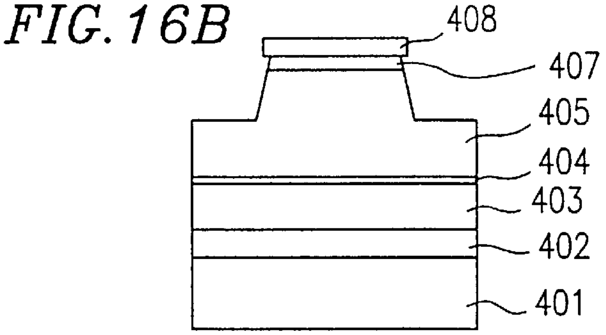

Then, as illustrated in FIG. 16B, a mask 408 having a predetermined pattern is formed on the layered structure produced as described above using a typical photolithography technique, and a stripe-shaped ridge portion (convex portion) is formed by an etching process. The shape of the mask 408 and/or the etching conditions are adjusted so that the bottom portion of the ridge portion has a width of about 4.0 μm while the final thickness of the p-type $Al_{0.5}Ga_{0.5}As$ cladding layer 405 is about 0.4 μm.

Figure 16C:
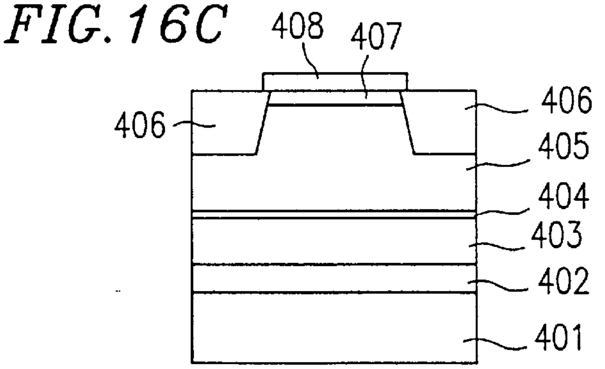

Thereafter, as illustrated in FIG. 16C, the n-type GaAs layer 406 is formed (regrown) on both sides of the ridge portion so as to have a thickness of about 0.6 μm by an MOCVD selective growth method using the mask 408.

Figure 16D:
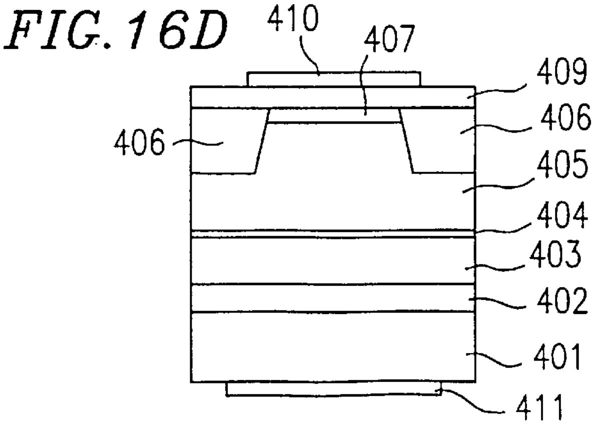

Subsequently, after the mask 408 is removed, as illustrated in FIG. 16D, the p-type GaAs contact layer 409 is formed by the MOCVD method. The electrodes 410 and 411 are then formed, thereby completing the semiconductor laser device.

During the growth process of the n-type layers 402, 403, and 406 by the MOCVD method, carbon, as well as Si as an n-type dopant, is added as described above. For example, the carbon addition concentration is set to about $2\times10^{17}$ $cm^{-3}$ while the Si addition concentration is set to about $2\times10^{18}$ $cm^{-3}$.

In the above production process, when the n-type GaAs current blocking layer 406 is formed on the p-type AlGaAs cladding layer 405 by the MOCVD selective growth method as illustrated in FIG. 16C following the etching process (i.e., the second MOCVD method, or the regrowth process), since the conductivity types are different on the opposite sides of the regrowth interface, band bending may occur. In order to prevent this, a p-type GaAs layer (not shown) having a thickness of about 0.003 μm to about 0.05 μm, for example, may be grown between the n-type GaAs current blocking layer 406 and the p-type AlGaAs cladding layer 405. However, the thickness of the p-type GaAs layer provided for this purpose is not limited to the above.

Moreover, in order to reliably etch away an intended amount of the p-type $Al_{0.5}$ $Ga_{0.5}As$ cladding layer 405 in the etching process as illustrated in FIG. 16B, one or more $Al_kGa_{1-k}As$ layer(s) (k≧0) may be inserted in a predetermined position within the p-type $Al_{0.5}Ga_{0.5}As$ cladding layer 405 so as to serve as an etching stop layer.

EXAMPLE 5

In accordance with the present example, the n-type current blocking layer, in the semiconductor laser device having the structure illustrated in FIG. 15, is formed of $Al_{0.7}Ga_{0.3}As$ instead of GaAs as in Example 4. Other features regarding the structure and the materials used as well as the employed process parameters are the same as those of Example 4, and thus will not be further described below.

In the structure of the semiconductor laser device of the present example, an electric current is injected through the p-type GaAs contact layer 409, and flows through the striped portion of the p-type $Al_{0.5}Ga_{0.5}As$ cladding layer 405 due to the presence of the n-type $Al_{0.7}Ga_{0.3}As$ current blocking layer, thereby flowing in a concentrated manner into a region of the $Al_{0.15}Ga_{0.85}As$ active layer 404 beneath the striped portion and generating laser oscillation in that region. The refractive index of the n-type $Al_{0.7}Ga_{0.3}As$ current blocking layer is less than that of the p-type $Al_{0.5}Ga_{0.5}As$ cladding layer 405, whereby the generated laser light is stably confined in a region in the vicinity of the striped portion of the p-type AlGaAs cladding layer 405. By setting the stripe width to about 4 μm to about 5 μm, it is possible to obtain a single transverse mode and to obtain a semiconductor laser device with excellent reliability and stability.

Particularly, since the bandgap value of the n-type $Al_{0.7}Ga_{0.3}As$ current blocking layer used in the present example is greater than that of the $Al_{0.15}Ga_{0.85}As$ active layer 404, the generated laser light is not absorbed by the n-type $Ga_{0.7}Ga_{0.3}As$ current blocking layer, but is stably confined within a region in the vicinity of the striped portion of the p-type AlGaAs cladding layer 405. Therefore, a laser output of about 30 mW is obtained with a cavity length of about 300 μm and a threshold current of about 35 mA, thus realizing a desirable low current operation.

As in Example 4, when the n-type $Al_{0.7}Ga_{0.3}As$ current blocking layer is formed on the p-type AlGaAs cladding layer 405 by the MOCVD selective growth method following the etching process (i.e., the second MOCVD method, or the regrowth process), since the conductivity types are different on the opposite sides of the regrowth interface, band bending may occur. In order to prevent this, a p-type $Ga_{0.7}Ga_{0.3}As$ layer (not shown) having a thickness of about 0.003 μm to about 0.05 μm, for example, may be grown between the n-type $Al_{0.7}Ga_{0.3}As$ current blocking layer and the p-type AlGaAs cladding layer 405. However, the thickness of the p-type $Al_{0.7}Ga_{0.3}As$ layer provided for this purpose is not limited to the above.

Moreover, in order to reliably etch away an intended amount of the p-type $Al_{0.5}Ga_{0.5}As$ cladding layer 405, one or more $Al_kGa_{1-k}As$ layer(s) (k≧0) may be inserted in a predetermined position within the p-type $Al_{0.5}Ga_{0.5}As$ cladding layer 405 so as to serve as an etching stop layer.

EXAMPLE 6

Figure 17:
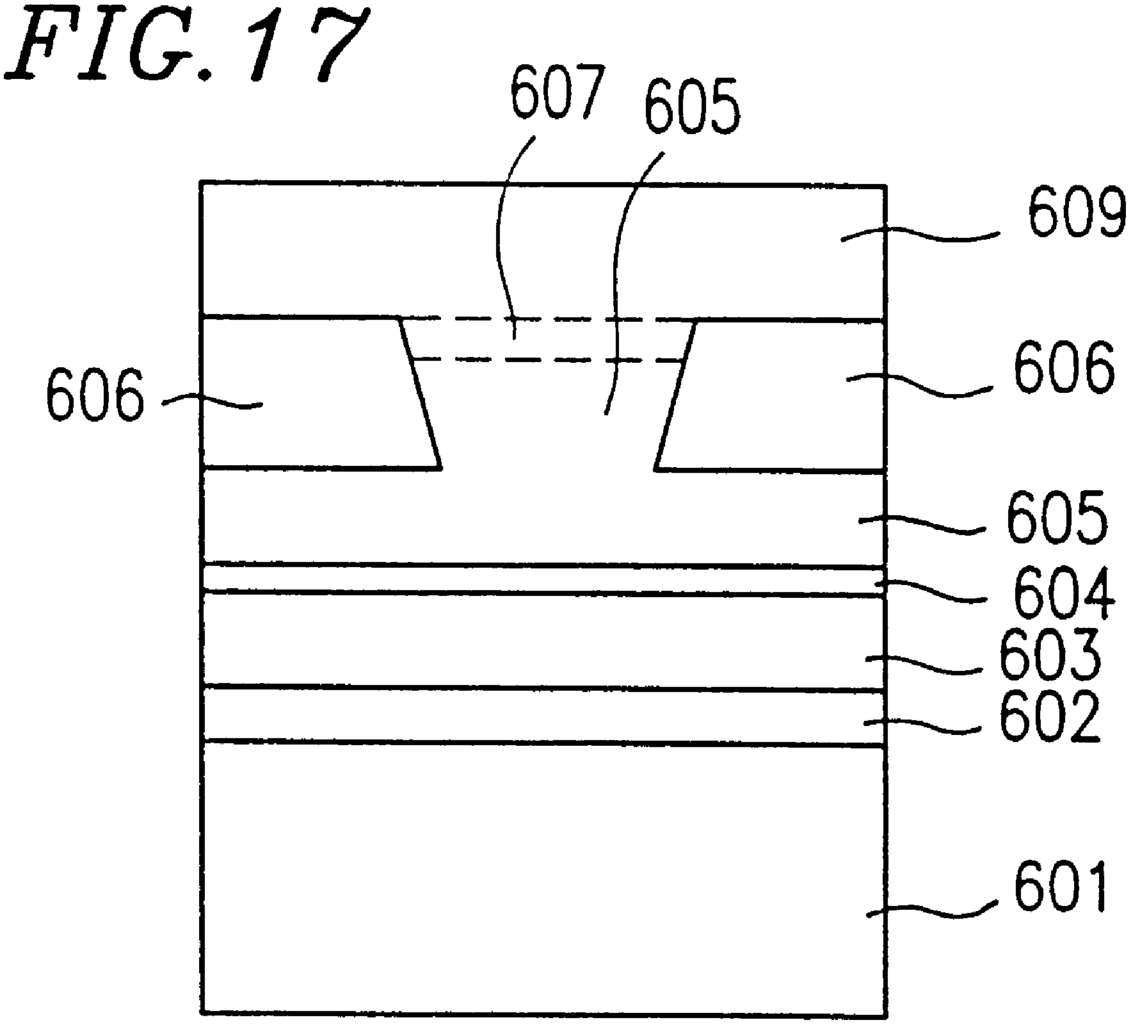
FIG. 17 is a cross-sectional view illustrating a structure of a semiconductor light emitting device according to Example 6 of the present invention.

FIG. 17 is a cross-sectional view illustrating a III–V group compound semiconductor laser device produced in accordance with the present example.

In the cross-sectional view of FIG. 17, an n-type GaAs buffer layer 602, an n-type $Al_{0.5}Ga_{0.5}As$ cladding layer 603, an undoped $Al_{0.15}Ga_{0.85}As$ active layer 604, a p-type $Al_{0.5}Ga_{0.5}As$ cladding layer 605 and an n-type GaAs current blocking layer 606 are formed on an n-type GaAs substrate 601. The n-type GaAs current blocking layer 606 is formed to have a stripe-shaped concave portion, and the p-type $Al_{0.5}Ga_{0.5}As$ cladding layer 605 is buried to fill at least a portion of the stripe-shaped concave portion. Thus, a current blocking structure where the 1striped portion functions as a current path is formed.

A p-type GaAs intermediate layer 607 is also formed on the striped portion, and a p-type GaAs contact layer 609 is further formed on the p-type GaAs intermediate layer 607 and the n-type GaAs current blocking layer 606. The p-side and n-side electrodes are omitted in FIG. 17. Moreover, the formation of the p-type GaAs intermediate layer 607 may be omitted.

When producing a semiconductor laser device having the above structure, in accordance with the present example, carbon, as well as Si as an n-type dopant, is added in the growth process of an n-type layer. The function of the carbon simultaneously added as described above and the method for the simultaneous addition are similar to those described in Example 4, and will not be further described below.

In the structure illustrated in FIG. 17, an electric current is injected through the p-type GaAs contact layer 609, and flows through the striped portion of the p-type $Al_{0.5}Ga_{0.5}As$ cladding layer 605 due to the presence of the n-type GaAs current blocking layer 606. Thus, the current flows in a concentrated manner into a region of the $Al_{0.15}Ga_{0.85}As$ active layer 604 beneath the striped portion, and causes laser oscillation to be generated in that region.

Although the refractive index of the n-type GaAs current blocking layer 606 is greater than that of the p-type $Al_{0.5}Ga_{0.5}As$ cladding layer 605, the bandgap value of the n-type GaAs current blocking layer 606 is less than that of the $Al_{0.15}Ga_{0.85}As$ active layer 604, whereby the n-type GaAs current blocking layer 606 absorbs light. Therefore, the generated laser light is stably confined in a region in the vicinity of the striped portion of the p-type AlGaAs cladding layer 605 due to the light absorption by the n-type GaAs current blocking layer 606. By setting the stripe width to about 4 μm to about 5 μm, it is possible to obtain a single transverse mode and to obtain a semiconductor laser device with excellent reliability and stability.

As in Example 4, when the n-type GaAs current blocking layer 606 is formed on the p-type AlGaAs cladding layer 605 by the MOCVD selective growth method following the etching process (i.e., the second MOCVD method, or the regrowth process), since the conductivity types are different on the opposite sides of the regrowth interface, band bending may occur. In order to prevent this, a p-type GaAs layer (not shown) having a thickness of about 0.003 μm to about 0.05 μm, for example, may be grown between the n-type GaAs current blocking layer 606 and the p-type AlGaAs cladding layer 605. However, the thickness of the p-type GaAs layer provided for this purpose is not limited to the above.

Moreover, in order to reliably etch away an intended amount of the p-type $Al_{0.5}Ga_{0.5}As$ cladding layer 605, one or more $Al_kG_{1-k}As$ layer(s) (k≧0) may be inserted in a predetermined position within the p-type $Al_{0.5}Ga_{0.5}As$ cladding layer 605 so as to serve as an etching stop layer.

EXAMPLE 7

In accordance with the present example, the n-type current blocking layer in the semiconductor laser device having the structure illustrated in FIG. 17 is formed of $Al_{0.7}Ga_{0.3}As$ instead of GaAs as in Example 6. Other features regarding the structure and the materials used as well as the employed process parameters are the same as those of Example 6, and thus will not be further described below.

In the structure of the semiconductor laser device of the present example, an electric current is injected through the p-type GaAs contact layer 609, and flows through the striped portion of the p-type $Al_{0.5}Ga_{0.5}As$ cladding layer 605 due to the presence of the n-type $Al_{0.7}Ga_{0.3}As$ current blocking layer. Thus, the current flows in a concentrated manner into a region of the $Al_{0.15}Ga_{0.85}As$ active layer 604 beneath the striped portion, and causes laser oscillation to be generated in that region.

The refractive index of the n-type $Al_{0.7}Ga_{0.3}As$ current blocking layer is less than that of the p-type $Al_{0.5}Ga_{0.5}As$ cladding layer 605, whereby the generated laser light is stably confined in a region in the vicinity of the striped portion of the p-type AlGaAs cladding layer 605. By setting the stripe width to about 4 μm to about 5 μm, it is possible to obtain a single transverse mode and to obtain a semiconductor laser device with excellent reliability and stability.

Particularly, since the bandgap value of the n-type $Al_{0.7}Ga_{0.3}As$ current blocking layer is greater than that of the $Al_{0.15}Ga_{0.85}As$ active layer 604, the generated laser light is not absorbed by the n-type $Al_{0.7}Ga_{0.3}As$ current blocking layer, but is stably confined within a region in the vicinity of the striped portion of the p-type AlGaAs cladding layer 605. Therefore, a laser output of about 35 mW is obtained with a cavity length of about 350 μm and a threshold current of about 35 mA, thus realizing a desirable low current operation.

As in Example 6, when the n-type $Al_{0.7}Ga_{0.3}As$ current blocking layer is formed on the p-type AlGaAs cladding layer 605 by the MOCVD selective growth method following the etching process (i.e., the second MOCVD method, or the regrowth process), since the conductivity types are different on the opposite sides of the regrowth interface, band bending may occur. In order to prevent this, a p-type $Al_{0.7}Ga_{0.3}As$ layer (not shown) having a thickness of about 0.003 μm to about 0.05 μm, for example, may be grown between the n-type $Al_{0.7}Ga_{0.3}As$ current blocking layer and the p-type AlGaAs cladding layer 605. However, the thickness of the p-type $Al_{0.7}Ga_{0.3}As$ layer provided for this purpose is not limited to the above.

Moreover, in order to reliably etch away an intended amount of the p-type $Al_{0.5}Ga_{0.5}As$ cladding layer 605, one or more $Al_kGa_{1-k}As$ layer(s) (k≧0) may be inserted in a predetermined position within the p-type $Al_{0.5}Ga_{0.5}As$ cladding layer 605 so as to serve as an etching stop layer.

As described above, in each of the semiconductor light emitting devices according to Examples 4 to 7, Si and carbon are both added in order to prevent the diffusion of, and thus stabilize the distribution of, the p-type dopant in the p-type layer in the DH junction structure which is the principal portion of the light emitting device, and to efficiently introduce Si, which exhibits amphoteric conductivity, into the III-group site so that it reliably functions as an n-type dopant. Thus, the conventional problem associated with the dopant diffusion is eliminated, thereby improving the reliability of the DH junction structure. Moreover, the use of such a DH junction structure with high reliability makes it possible to stably produce a high reliability semiconductor light emitting device which realizes low current operation and longitudinal multimode oscillation as well as low noise operation.

EXAMPLE 8

Hereinafter, another example of the present invention which realizes the suppression of dopant diffusion will be explained. In particular, in accordance with the present example, Si is used as an n-type dopant in an n-type cladding layer in an AlGaAs semiconductor light emitting device (semiconductor laser device) produced by the MOCVD method. In addition, the current blocking layer is provided in a two-layered blocking structure including a Se-doped layer, as an n-type current blocking layer closer to the p-n interface, with a Si-doped n-type current blocking layer formed thereon.

Figure 18:
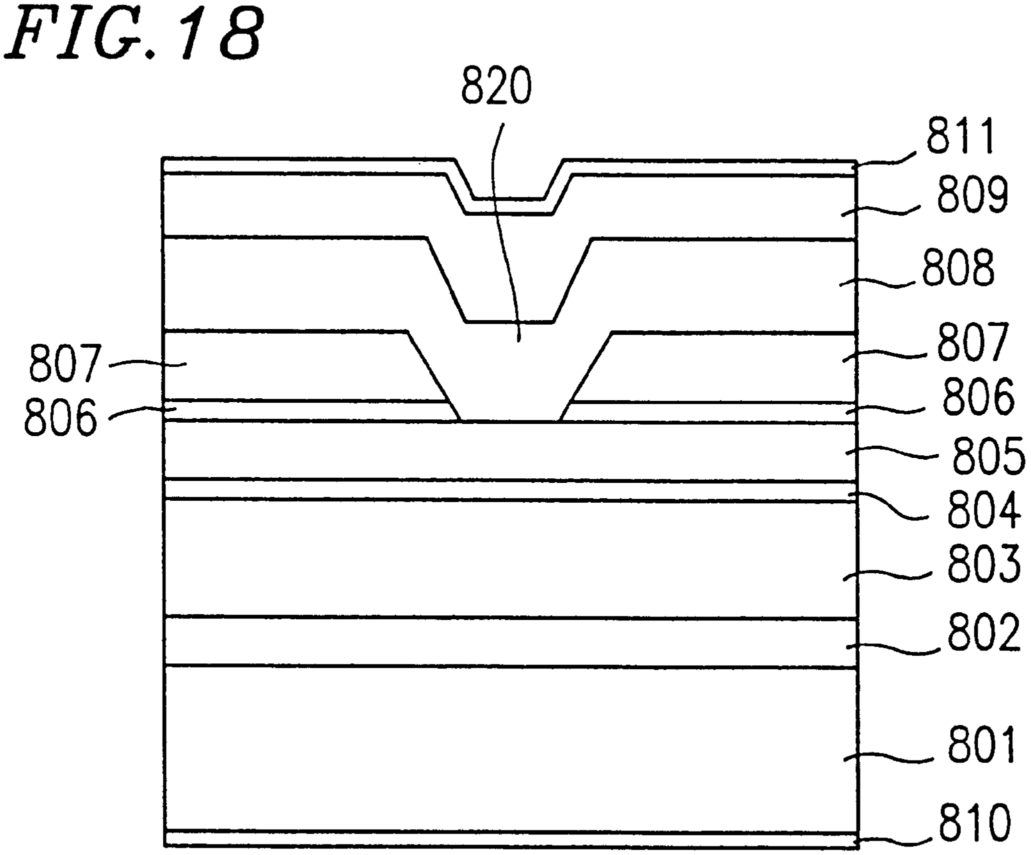
FIG. 18 is a cross-sectional view illustrating a structure of a semiconductor light emitting device according to Example 8 of the present invention.

FIG. 18 is a cross-sectional view illustrating a semiconductor laser device produced in accordance with the present example.

FIG. 18 illustrates a so-called "self-alignment " structure. In particular, a Si-doped n-type GaAs buffer layer 802 (carrier concentration: about $1.5\times10^{18}$ $cm^{-3}$, thickness: about 0.5 $\mu$m), a Si-doped n-type $Al_{0.5}Ga_{0.5}As$ cladding layer 803 (carrier concentration: about $4\times10^{17}$ $cm^{-3}$, thickness: about 1.0 $\mu$m), an undoped $Al_{0.14}Ga_{0.86}As$ active layer 804 (thickness: about 0.04 $\mu$m), a Zn-doped p-type $Al_{0.5}Ga_{0.5}As$ first cladding layer 805 (carrier concentration: about $4\times10^{17}$ $cm^{-3}$, thickness: about 0.3 $\mu$m), a Se-doped n-type AlGaAs first current blocking layer 806 (carrier concentration: about $2\times10^{18}$ $cm^{-3}$, thickness: about 0.03 $\mu$m) and a Si-doped n-type AlGaAs second current blocking layer 807. (carrier concentration: about $3\times10^{18}$ $cm^{-3}$, thickness: about 0.8 $\mu$m) are formed in this order on an n-type GaAs substrate 801 (carrier concentration: about $2\times10^{18}$ $cm^{-3}$) by, for example, the MOCVD-method. Then, a portion of the n-type first and second current blocking layers 806 and 807 (they may be referred to collectively as the "n-type current blocking layer") is removed, for example, in a striped-shape about 4 $\mu$m wide, thereby forming a current path (a striped portion) 820.

Then, a Zn-doped p-type $Al_{0.5}Ga_{0.5}As$ second cladding layer 808 (carrier concentration: about $1.5\times10^{18}$ $cm^{-3}$, thickness: about 1 $\mu$m) and a Zn-doped p-type GaAs contact layer 809 (carrier concentration: about $4\times10^{18}$ $cm^{-3}$, thickness: about 1 $\mu$m) are further formed by, for example, the MOCVD method, so as to cover the striped portion 820 and the n-type second current blocking layer 807. A p-side electrode 811 and an n-side electrode 810 are respectively formed on the p-type contact layer 809 and on the reverse surface of the n-type GaAs substrate 801. The process to this point is performed while the device is still in a wafer state.

Thereafter, the wafer is cleaved into a plurality of bars, and light-emitting facets corresponding to the opposite ends of each bar are both coated with a predetermined reflective film. Then, the bar is divided into a plurality of chips, thereby obtaining individual semiconductor laser devices. Thus, a semiconductor laser device which provides an output of about 5 mW at an oscillation wavelength of about 780 nm is obtained.

An apparatus having the structure described with reference to FIG. 3 may be used in the MOCVD process.

In particular, in the apparatus illustrated in FIG. 3, trimethylgallium (TMGa) and trimethylaluminum (TMAl) are used as materials for III-group elements (Ga and Al); arsine ($ASH_3$) as a V-group element (As) material; monosilane ($SiH_4$) and hydrogen selenide ($H_2Se$) as materials for Si and Se as n-type dopants; and diethylzinc (DEZn) as a material for Zn as a p-type dopant. A substrate is placed inside the reaction chamber (growth chamber) 30, the internal pressure of the reaction chamber 30 is set to about 76 Torr, and the substrate temperature is set to about 750° C. using the RF coil 31. Then, the mass flow controllers (MFCs) and the valves are appropriately controlled so as to set the ratio (V/III ratio) between the amount of supply of the material compound containing the III-group material (i.e., the amount of supply of TMGa, or the total amount of supply of TMGa and that of TMAl) and the amount of supply of the material compound containing the V-group element (i.e., the amount of supply of $AsH_3$) to a predetermined constant value (about 120). Then, the crystal growth process of the respective layers proceeds while the above-described conditions are kept constant during the process.

In accordance with the conventional techniques, various problems occur due to the fact that Se as an n-type dopant and either Zn or Mg as a p-type dopant are liable to mutual diffusion. For example, Zn as a p-type dopant doped into the p-type first cladding layer diffuses into the n-type current blocking layer or even into the n-type cladding layer through the active layer, due to the effect of heat history, or the like. On the other hand, Se as an n-type dopant doped into the n-type current blocking layer or the n-type cladding layer diffuses into the p-type first cladding layer.

In order to solve the above problem, the present inventors first replace the n-type dopant in the n-type cladding layer 803 with Si so as to suppress the diffusion of the p-type dopant in the p-type cladding layer 805 into the n-type cladding layer 803.

Moreover, the n-type current blocking layer is formed in a two-layered structure including the n-type first current blocking layer 806 and the n-type second current blocking layer 807. Se is used as an n-type dopant for the n-type first current blocking layer 806 on the p-type first cladding layer 805, while Si as an n-type dopant for the n-type second current blocking layer 807 on the n-type first current blocking layer 806. Thus, in a region of the p-type first cladding layer 805 located beneath the n-type current blocking layer, Zn contained therein as a p-type dopant diffuses toward the n-type current blocking layer, thus causing a pile-up phenomenon whereby the p-type and n-type dopants are both concentrated on the n-type current blocking layer side of the p-n interface. Zn (p-type dopant) further diffuses into the n-type current blocking layer, and the diffusion continues until the amount of Se in the n-type first current blocking layer 806 (the product of the Se concentration and the thickness of the n-type first current blocking layer 806) becomes equal to the amount of Zn in the p-type first cladding layer 805 (the product of the preset Zn concentration and the thickness of the p-type first cladding layer 805).

If the amount of Zn in the p-type first cladding layer 805 is greater than the amount of Se in the n-type first current blocking layer 806, Se does not diffuse into the p-type first cladding layer 805. Moreover, even when the dopant concentration in the n-type first current blocking layer 806 is varied, the current blocking function is ensured by the presence of the n-type second current blocking layer 807.

Therefore, in the structure of the semiconductor laser device of the present example having such a feature, the carrier concentration of the p-type first cladding layer 805 is relatively high in the striped portion and is relatively low outside the striped portion (i.e., beneath the current blocking layer), so that the current is effectively concentrated in the striped portion, thereby reducing the operating current.

The dopant concentration (dopant distribution) in the semiconductor laser device produced as described above in accordance with the present example is measured and studied as follows.

First, layers up to the Si-doped n-type AlGaAs second current blocking layer 807 are formed according to the above-described process, and the striped portion 820 is formed so as to have a width of about 1000 μm, thereby obtaining a sample to be used for SIMS measurement of the dopant concentration in the vicinity of the striped portion 820.

Figure 19:
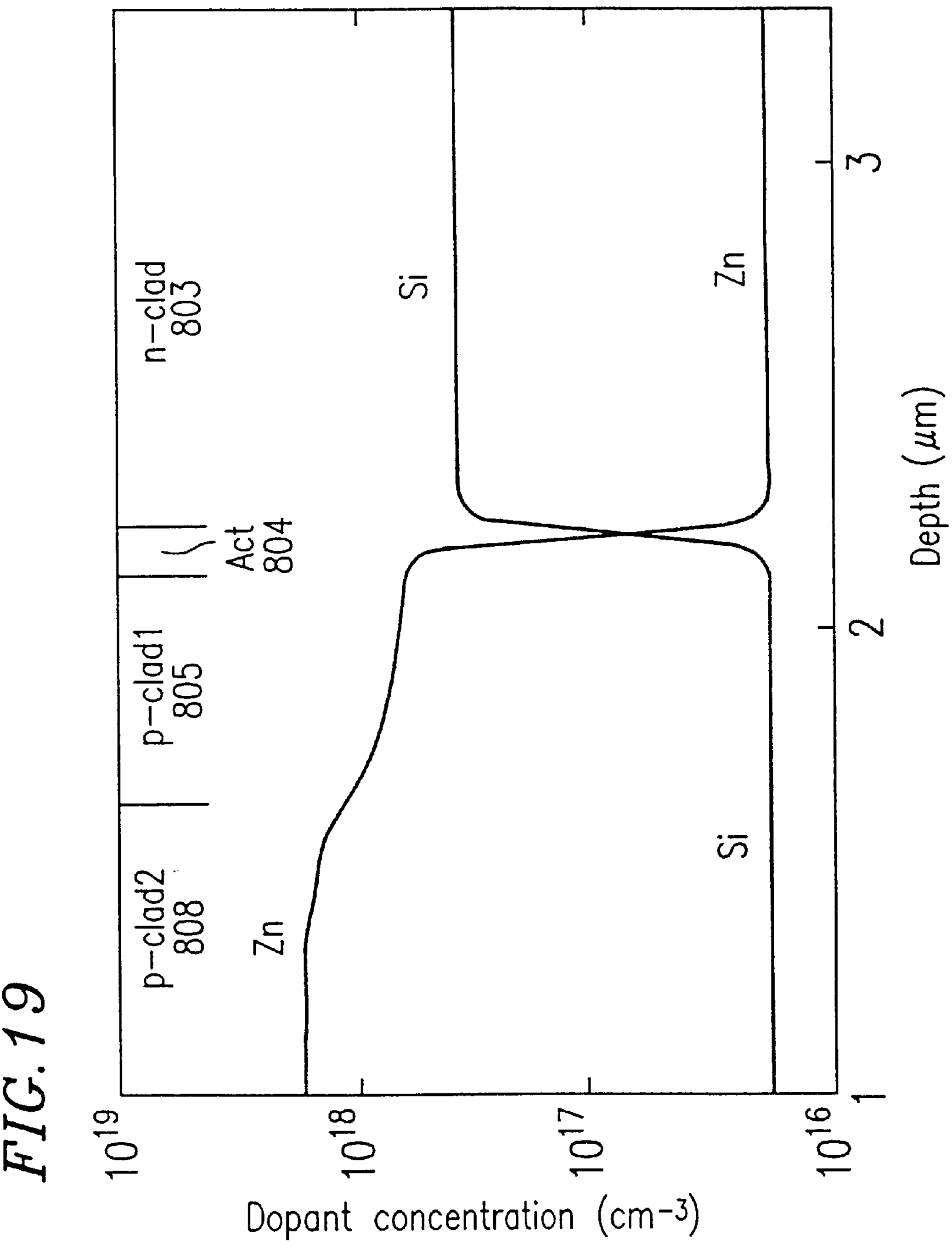
FIG. 19 illustrates SIMS profiles for a sample produced according to Example 8 of the present invention.

FIG. 19 illustrates the measured Zn and Si concentration profiles in the striped portion 820. The results show that Zn diffuses into the active layer 804 but does not diffuse into the n-type cladding layer 803.

Figure 20:
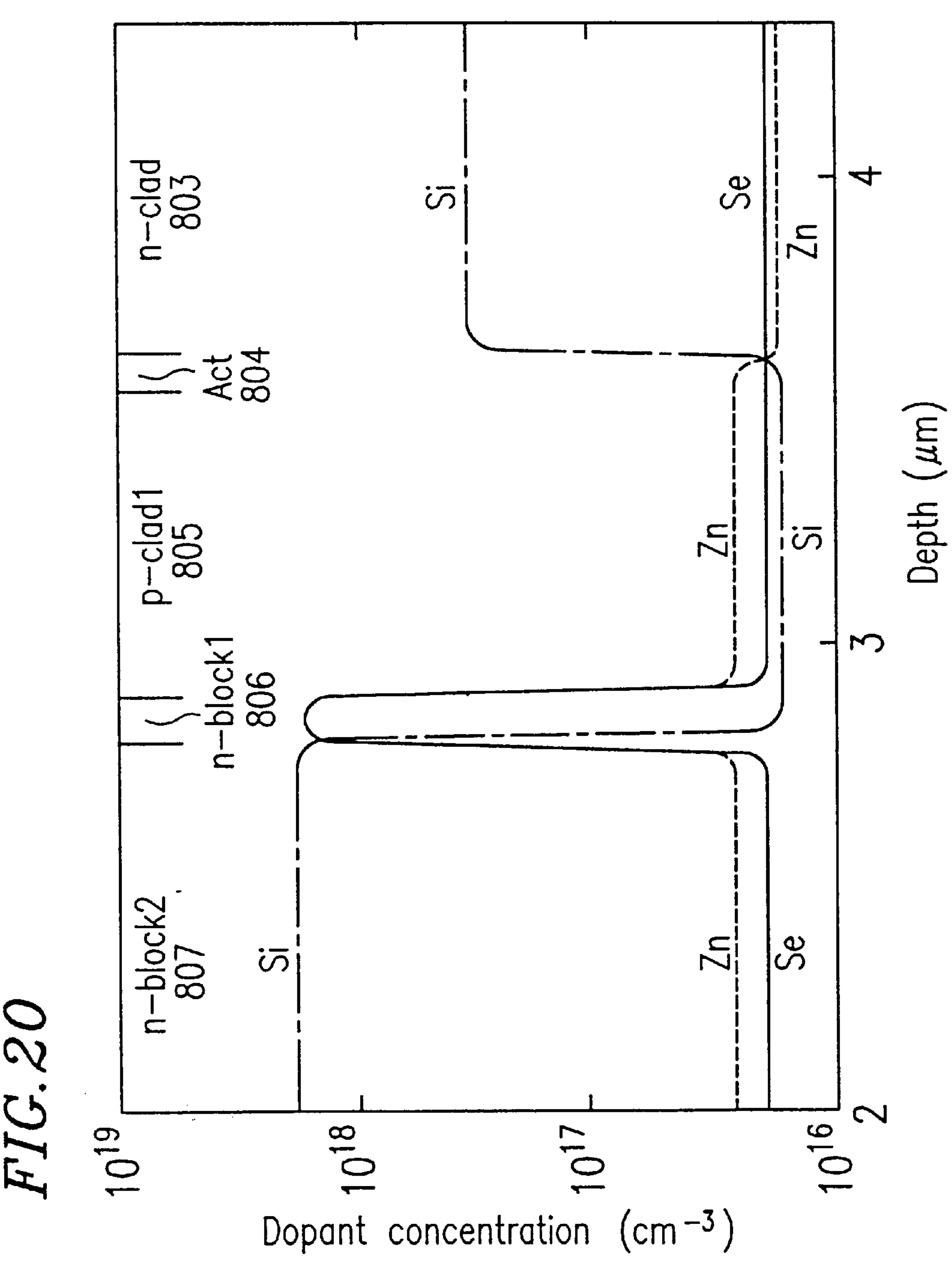
FIG. 20 illustrates other SIMS profiles for the sample produced according to Example 8 of the present invention.
Figure 21:
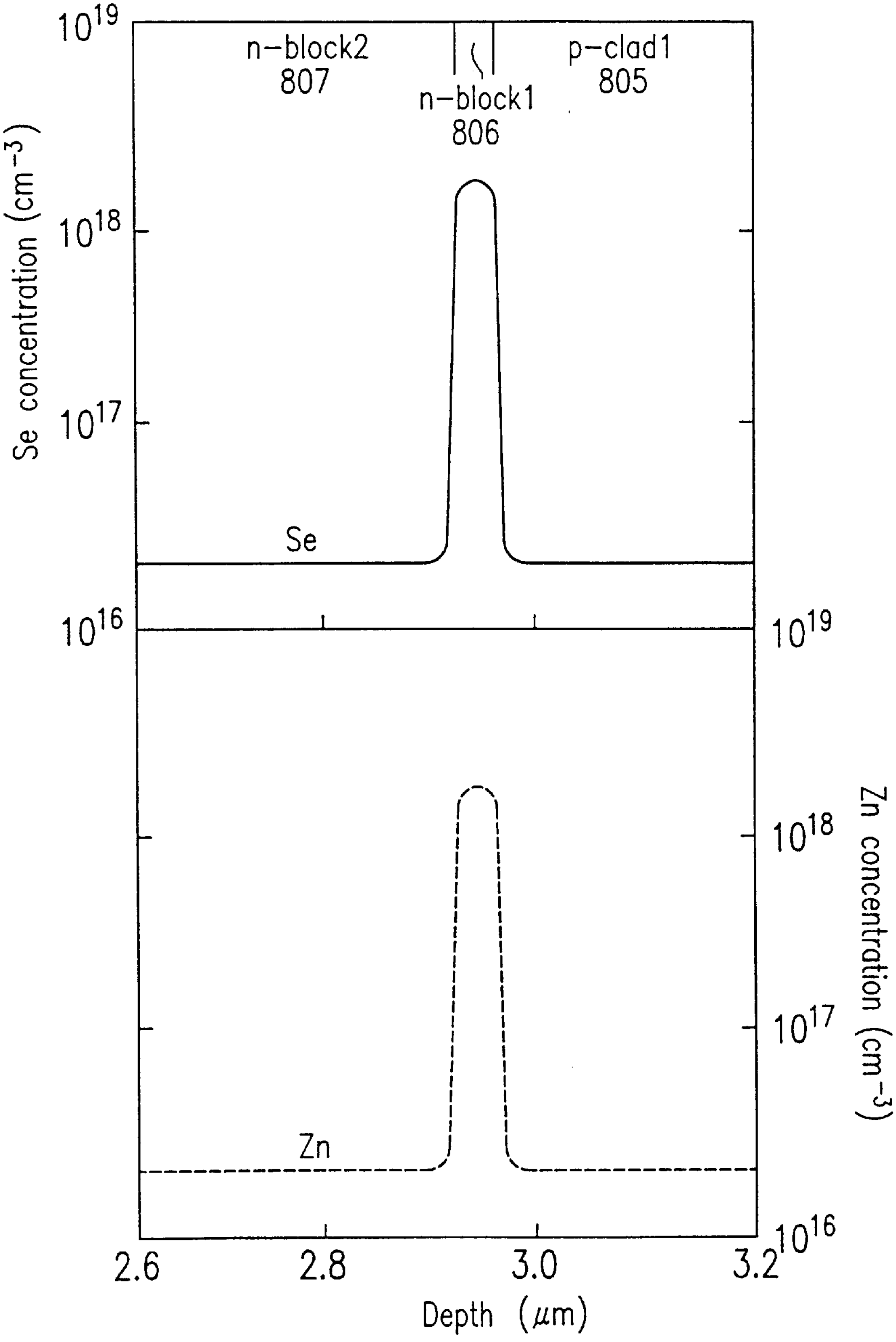
FIG. 21 is an enlarged view illustrating a portion of the SIMS profiles illustrated in FIG. 20.

FIG. 20 illustrates the measured Zn, Si and Se concentration profiles outside the striped portion 820. FIG. 21 is an enlarged view illustrating a portion of each of the measured Se and Zn concentration profiles illustrated in FIG. 20 in the vicinity of the first current blocking layer 806. The results show that Zn diffuses into the first current blocking layer 806 but does not diffuse into the n-type second current blocking layer 807. Moreover, diffusion of Se or Si is not observed. Thus, the Zn concentration in the portion of the p-type first cladding layer 805 located outside the striped portion 820 (i.e., beneath the current blocking layer 806) is about $4\times10^{16}$ $cm^{-3}$, being lower than the dopant concentration in the other portion of the p-type first cladding layer 805 directly beneath the striped portion 820.

The operating current of the semiconductor laser device produced as described above in accordance with the present example is typically about 32 mA. Thus, it is confirmed that the semiconductor laser device of the present example is operable at an operating current lower than that (about 38 mA) of a conventional device where the n-type current blocking layer is provided as a single Si-doped layer. Moreover, the increase in the operating current after being continuously operated to produce an output of about 5 mW for about 200 hours at about 70° C. is typically about 0.1 mA, which is superior to that (about 0.8 mA) of the conventional device where the n-type current blocking layer is provided as a single Si-doped layer.

In FIG. 18, some of the layers are not shown for simplicity. In particular, a group of etching stop layers having a two-layered structure is provided between the p-type first cladding layer 805 and the n-type first current blocking layer 806. Moreover, the n-type second current blocking layer 807 is actually formed as a group of Si-doped layers including about four layers having respectively different crystal ratios.

The respective Al mole fractions of the layers are not limited to the values described above. For example, the Al mole fraction of the active layer may be zero whereby the active layer is a GaAs active layer.

Furthermore, the thickness of the active layer may be slightly reduced from that described above, so as to provide a 40 mW-output-class semiconductor laser device instead of the above-described 5 mW-output-class semiconductor laser device. In such a case, the optimal carrier concentration is substantially the same as that described above.

EXAMPLE 9

In Example 8 above, the layers included in the semiconductor laser device having the structure illustrated in FIG. 18 are all formed by the MOCVD method. On the other hand, in accordance with the present example, the regrowth process is performed by the LPE method instead of the MOCVD method.

In particular, the layers from the Si-doped GaAs buffer layer 802 to the Si-doped AlGaAs second current blocking layer 807 are grown on the n-type GaAs substrate 801 by the MOCVD method, and a predetermined striped portion 820 is formed by an etching process. Thereafter, a Mg-doped p-type second cladding layer (carrier concentration: about $1.5\times10^{18}$ $cm^{-3}$, thickness: about 1 μm) and a Mg-doped p-type GaAs contact layer (carrier concentration: about $4\times10^{18}$ $cm^{-3}$, thickness: about 1 μm) are formed by the LPE method. The subsequent production process thereafter is similar to that of Example 8.

Operating characteristics comparable to those of Example 8 can be realized also in the semiconductor laser device obtained as described above in accordance with the present example. Moreover, the optimal carrier concentration values of the n-type cladding layer 803 and the p-type first cladding layer 805 are substantially the same as those of Example 8. Thus, only a slight difference results from whether the regrowth process is performed by the MOCVD method or by the LPE method.

EXAMPLE 10

Figure 22:
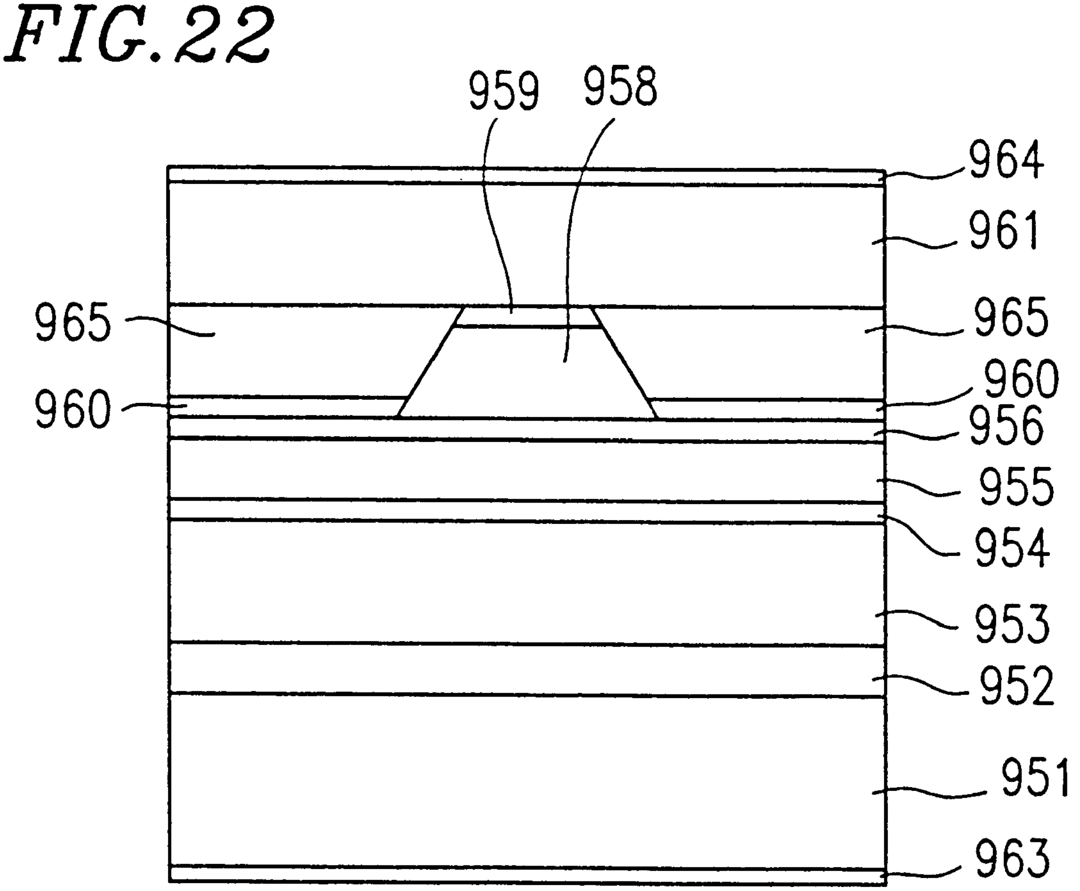
FIG. 22 is a cross-sectional view illustrating a structure of a semiconductor light emitting device according to Example 10 of the present invention.

FIG. 22 is a cross-sectional view illustrating a semiconductor laser device produced in accordance with the present example.

FIG. 22 illustrates a so-called "ridge type " structure. In particular, a Si-doped n-type GaAs buffer layer 952 (carrier concentration: about 1x10 $cm^{-3}$, thickness: about 0.5 μm), a Si-doped n-type $Al_{0.5}Ga_{0.5}As$ cladding layer 953 (carrier concentration: about $4\times10^{17}$ $cm^{-3}$, thickness: about 1.0 μm), an undoped $Al_{0.14}Ga_{0.86}As$ active layer 954 (thickness: about 0.04 μm), a Zn-doped p-type $Al_{0.5}Ga_{0.4}As$ first cladding layer 955 (carrier concentration: about $3\times10^{17}$ $cm^{-3}$, thickness: about 0.3 μm), a Zn-doped p-type GaAs etching stop layer 956 (carrier concentration: about $1\times10^{18}$ $cm^{-3}$, thickness: about 0.003 μm), a Zn-doped p-type $Al_{0.5}Ga_{0.5}As$ second cladding layer 958 (carrier concentration: about $1.5\times10^{18}$ $cm^{-3}$, thickness: about 1 μm) and a Zn-doped p-type GaAs cap layer 959 (carrier concentration: about $3\times10^{18}$ $cm^{-3}$ , thickness: about 1 μm) are formed in this order on an n-type GaAs substrate 951 (carrier concentration: about $2\times10^{18}$ $cm^{-3}$) by, for example, the MOCVD method. Then, the p-type cap layer 959 and the p-type second cladding layer 958 are partially removed so as to leave a stripe-shaped ridge portion.

Thereafter, a Se-doped n-type AlGaAs first current blocking layer 960 (carrier concentration: about $1\times10^{18}$ $cm^{-3}$, thickness: about 0.03 μm) and a Si-doped n-type AlGaAs second current blocking layer 965 (carrier concentration: about $3\times10^{18}$ $cm^{-3}$, thickness: about 0.8 μm) are formed in this order on both sides of the ridge, again by the MOCVD method. At this time, a portion of the n-type first and second current blocking layers 960 and 965 (they may be referred to collectively as the "n-type current blocking layer") which has been deposited on the p-type cap layer 959 is removed by, for example, an etching process.

Then, a Zn-doped p-type GaAs contact layer 961 (carrier concentration: about $3\times10^{18}$ $cm^{-3}$) is further formed by, for example, the MOCVD method, so as to cover the p-type cap layer 959 and the n-type second current blocking layer 965. A p-side electrode 964 and an n-side electrode 963 are respectively formed on the p-type contact layer 961 and on the reverse surface of the n-type GaAs substrate 951. The process to this point is performed while the device is still in a wafer state.

Thereafter, the wafer is cleaved into a plurality of bars, and light-emitting facets corresponding to the opposite ends of each bar are both coated with a predetermined reflective film. Then, the bar is divided into a plurality of chips, thereby obtaining individual semiconductor laser devices.

The operating current of the semiconductor laser device produced as described above in accordance with the present example is typically about 34 mA, being comparable to that of the device with a self-alignment structure described above as Example 8. Moreover, the other operating characteristics are also comparable between the present example and Example 8. Thus, no significant characteristic difference is seen resulting from whether the device has the self-alignment structure or the ridge type structure.

As described above, in accordance with Examples 8 to 10 of the present invention, in the AlGaAs semiconductor light emitting device whose light emitting portion is formed by the MOCVD method, the n-type current blocking layer is provided in a two-layered structure including a Se-doped layer and a Si-doped layer. In particular, the Se-doped layer is closer to the p-type first cladding layer, thereby making it possible to suppress the p-type to n-type inversion of the p-type first cladding layer and to produce with a high production yield a semiconductor light emitting device with satisfactory operating characteristics. Thus, reduction in the production cost of a semiconductor light emitting device and efficient use of the material resource are realized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A light emitting device, comprising:

a plurality of n-type III–V group compound semiconductor layers;

a plurality of p-type III–V group compound semiconductor layers; and an active layer, disposed between the plurality of n-type and the plurality of p-type III–V group compound semiconductor layers, wherein carbon atoms and II-group element atoms are both added to at least one of the plurality of p-type III–V group compound semiconductor layers.

2. A light emitting device according to claim 1, wherein a ration between a concentration of the carbon atoms and a concentration of the II-group element atoms, which are both added to at least one layer of the plurality of p-type III–V group compound semiconductor layers, is in a range between about 1 and about 10.

3. A light emitting device according to claim 1, further comprising:

at least one n-type III–V group semiconductor current blocking layer, wherein at least one layer of the plurality of p-type III–V group compound semiconductor layers, to which the carbon atoms and the II-group element atoms are both added, is in contact with at least one n-type III–V group compound semiconductor current blocking layer.

4. A light emitting device according to claim 1, wherein at least one layer of the plurality of p-type III–V group compound semiconductor layer, to which the carbon atoms and the II-group element atoms are both added, is in contact with the active layer.

5. A method for producing a semiconductor light emitting device, comprising the step of growing a layered structure on a surface of a substrate, the layered structure at least including a plurality of n-type III–V group compound semiconductor layers, a plurality of p-type III–V group compound semiconductor layers, and an active layer, wherein carbon atoms and II-group element atoms are both added when growing at least one layer of the plurality of p-type III–V group compound semiconductor layers.

6. A light emitting device, comprising:

an n-type substrate;

a plurality of first n-type III–V group compound semiconductor layers formed on the n-type substrate;

an active layer formed on the plurality of n-type III–V group compound semiconductor layers;

a plurality of p-type III–V group compound semiconductor layers formed on the active layer; and at least one second n-type III–V group compound semiconductor layer formed so as to bury at least one layer of the plurality of p-type III–V group compound semiconductor layers, herein carbon atoms and II-group element atoms are both added to at least one layer of the plurality of p-type III–V group compound semiconductor layers buried by the at least one second n-type III–V group compound semiconductor layer.

* * * * *